US011977121B2

(12) United States Patent
O'Mahony et al.

(10) Patent No.: US 11,977,121 B2
(45) Date of Patent: May 7, 2024

(54) AUTONOMOUS BATTERY MONITORING SYSTEM

(71) Applicant: Analog Devices International Unlimited Company, Limerick (IE)

(72) Inventors: Shane O'Mahony, Ballybraher (IE); Narsimh Dilip Kamath, Bangalore (IN); Tze Lei Poo, Cambridge, MA (US); Gina G. Aquilano, Somerville, MA (US); Hemtej Gullapalli, Littleton, MA (US); Lance Robert Doherty, Somerville, MA (US)

(73) Assignee: Analog Devices International Unlimited Company, Limerick (IE)

( * ) Notice: Subject to any disclaimer, the term of this patent is extended or adjusted under 35 U.S.C. 154(b) by 31 days.

(21) Appl. No.: 17/474,703

(22) Filed: Sep. 14, 2021

(65) Prior Publication Data

US 2022/0082627 A1 Mar. 17, 2022

Related U.S. Application Data

(60) Provisional application No. 63/078,846, filed on Sep. 15, 2020.

(51) Int. Cl.
*G01R 31/378* (2019.01)
*G01R 31/367* (2019.01)
*G01R 31/389* (2019.01)

(52) U.S. Cl.
CPC ......... *G01R 31/378* (2019.01); *G01R 31/367* (2019.01); *G01R 31/389* (2019.01)

(58) Field of Classification Search
CPC .... G01R 31/378; G01R 31/367; G01R 31/52; G01R 31/389; G01R 31/396; H02H 3/16; H02H 1/0007; H01M 10/482; B60L 58/20

(Continued)

(56) References Cited

U.S. PATENT DOCUMENTS 7,245,107 B2    7/2007   Moore et al.
7,554,294 B2    6/2009   Srinivasan et al.
(Continued)

FOREIGN PATENT DOCUMENTS

CN    102024999 A    4/2011
CN    102231446 B    10/2013
(Continued)

OTHER PUBLICATIONS

International Preliminary Report on Patentability mailed Mar. 30, 2023 in connection with International Application No. PCT/EP2021/075340.

(Continued)

*Primary Examiner* — Lee E Rodak
*Assistant Examiner* — Trung Q Nguyen
(74) *Attorney, Agent, or Firm* — Wolf, Greenfield & Sacks, P.C.

(57) ABSTRACT

Described herein is a device for autonomously monitoring a battery is provided. The device is integrated with the battery (e.g., by being electrically coupled to the battery). The device obtains measurement data by injecting electrical signals into the battery and measuring an electrical response of the battery. The device participates in an authentication protocol with a computing device to verify a unique identity of the device to the computing device. After performing the authentication protocol verifying the unique identity of the device, the device transmits battery data to the computer. Further, techniques for verifying the identity of the battery using measurement data obtained by the device are described herein. The techniques generate a battery signature using the measurement data that is then used to verify the identity of the battery. For example, the battery signature may be used to determine whether the battery is counterfeit or defective.

17 Claims, 10 Drawing Sheets

(58) Field of Classification Search
USPC .......... 324/124, 425–434, 500, 525, 756.06
See application file for complete search history.

(56) References Cited

U.S. PATENT DOCUMENTS

| | | | |
|---|---|---|---|
| 7,772,850 | B2 | 8/2010 | Bertness |
| 8,738,310 | B2 | 5/2014 | Swanton |
| 8,922,166 | B2 | 12/2014 | White et al. |
| 9,145,059 | B2 | 9/2015 | Gibbs et al. |
| 9,146,595 | B2 | 9/2015 | Forutanpour et al. |
| 9,166,261 | B2 | 10/2015 | Ibi et al. |
| 9,263,776 | B2 | 2/2016 | Yun et al. |
| 9,316,694 | B2 | 4/2016 | Campbell et al. |
| 9,444,083 | B2 | 9/2016 | Yasui et al. |
| 9,454,888 | B2 | 9/2016 | Xie et al. |
| 9,457,666 | B2 | 10/2016 | Caldeira et al. |
| 9,519,028 | B2 | 12/2016 | Greenberg |
| 9,548,519 | B2 | 1/2017 | Wade |
| 9,594,121 | B2 | 3/2017 | Frost et al. |
| 9,668,032 | B2 | 5/2017 | Wade et al. |
| 9,720,478 | B2 | 8/2017 | Hanafusa |
| 9,726,763 | B2 | 8/2017 | Dempsey et al. |
| 9,746,524 | B2 | 8/2017 | Petrucelli |
| 9,766,293 | B2 | 9/2017 | Sims et al. |
| 9,995,792 | B2 | 6/2018 | Koba et al. |
| 10,089,499 | B2 | 10/2018 | Brochhaus |
| 10,145,898 | B2 | 12/2018 | Chen et al. |
| 10,175,301 | B1 | 1/2019 | Brubacher et al. |
| 10,424,961 | B1 | 9/2019 | Maluf et al. |
| 10,440,542 | B2 | 10/2019 | Thomas et al. |
| 2009/0189614 | A1 | 7/2009 | Crawford et al. |
| 2013/0069661 | A1 | 3/2013 | Rich et al. |
| 2014/0201090 | A1 | 7/2014 | Liang |
| 2014/0229129 | A1 | 8/2014 | Campbell et al. |
| 2014/0342193 | A1 | 11/2014 | Mull et al. |
| 2015/0239365 | A1 | 8/2015 | Hyde et al. |
| 2015/0263395 | A1 | 9/2015 | Okabe et al. |
| 2016/0047861 | A1* | 2/2016 | Chen .................. H02J 7/0047 324/426 |
| 2016/0248130 | A1 | 8/2016 | Kurimoto et al. |
| 2016/0294019 | A1 | 10/2016 | Yamauchi et al. |
| 2016/0294206 | A1* | 10/2016 | Okawa ................ H02J 7/00047 |
| 2017/0021738 | A1 | 1/2017 | Brochhaus |
| 2017/0144562 | A1 | 5/2017 | Thomas et al. |
| 2017/0285113 | A1 | 10/2017 | Hsiao et al. |
| 2017/0324121 | A1 | 11/2017 | Yau |
| 2017/0324124 | A1 | 11/2017 | Nakaya |
| 2018/0097396 | A1 | 4/2018 | Qi et al. |
| 2018/0267109 | A1 | 9/2018 | Kutkut |
| 2019/0033395 | A1 | 1/2019 | Karner et al. |
| 2019/0296403 | A1 | 9/2019 | Ballantine et al. |
| 2019/0312317 | A1 | 10/2019 | Ballantine et al. |
| 2019/0317152 | A1 | 10/2019 | Ballantine et al. |
| 2022/0113356 | A1 | 4/2022 | Kasselman et al. |
| 2023/0120239 | A1 | 4/2023 | Kasselman et al. |

FOREIGN PATENT DOCUMENTS

| | | |
|---|---|---|
| CN | 103138019 B | 9/2015 |
| CN | 108258338 A | 7/2018 |
| CN | 105393127 B | 9/2018 |
| CN | 107336611 B | 6/2019 |
| CN | 106696730 B | 10/2019 |
| CN | 107681209 B | 12/2019 |
| CN | 111002842 A | 4/2020 |
| DE | 102015004834 A1 | 10/2016 |
| DE | 202018005683 U1 | 3/2019 |
| EP | 0 611 106 A1 | 8/1994 |
| EP | 0 323 539 A1 | 8/2011 |
| EP | 2 362 478 A1 | 8/2011 |
| EP | 2 571 076 A1 | 3/2013 |
| EP | 2 957 107 A1 | 12/2015 |
| EP | 3 032 271 A1 | 6/2016 |
| EP | 2 530 481 B1 | 8/2018 |
| EP | 3 657 570 A1 | 5/2020 |
| JP | H04-250376 A | 9/1992 |
| JP | 6094446 B2 | 3/2017 |
| KR | 101398344 B1 | 5/2014 |
| WO | WO 2014/126685 A1 | 8/2014 |
| WO | WO 2020/025943 A1 | 2/2020 |
| WO | WO 2020/077126 A1 | 4/2020 |

OTHER PUBLICATIONS

Sassano et al., Impedance Spectroscopy with Battery Cell Sensors. Microtec Nord, Fraunhofer Institut fur Siliziumtechnologie ISIT. Sep. 21, 2015, GPP1. 46 pages.

Sawhney et al., POISED-5, a portable on-board electrochemical impedance spectroscopy biomarker analysis device. Biomed Microdevices, Published online Jul. 4, 2019; 21:70, pp. 1-14.

Schneider et al., Automotive battery monitoring by wireless cell sensors. IEEE International Instrumentation and Measurement Technology Conference Proceedings, 2012, 5 pages.

Invitation to Pay Additional Fees for International Application No. PCT/EP2020/068083 mailed Sep. 29, 2020.

International Search Report and Written Opinion mailed Jan. 10, 2022 in connection with International Application No. PCT/EP2021/075340.

International Search Report and Written Opinion for International Application No. PCT/EP2020/068083 mailed Nov. 30, 2020.

International Preliminary Report on Patentability mailed Jan. 6, 2022 in connection with International Application No. PCT/EP2020/068083.

International Search Report and Written Opinion for International Application No. PCT/IB2021/000434 mailed Nov. 3, 2021.

International Preliminary Report on Patentability mailed Jan. 5, 2023 in connection with International Application No. PCT/IB2021/000434.

[No Author Listed], Electric Vehicle Enhanced Range, Lifetime And Safety ThroughINGenious battery management. Everlasting. 2017. 140 pages.

Kim et al., Cloud-Based Battery Condition Monitoring and Fault Diagnosis Platform for Large-Scale Lithium-Ion Battery Energy Storage Systems. Energies 2018, 11(1):1-15.

* cited by examiner

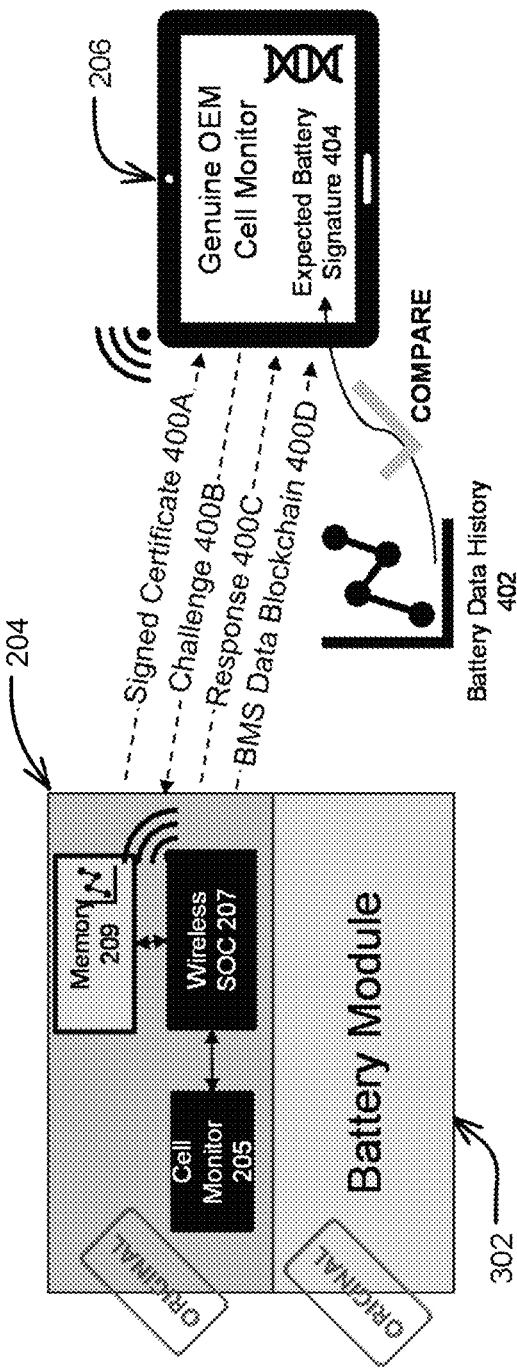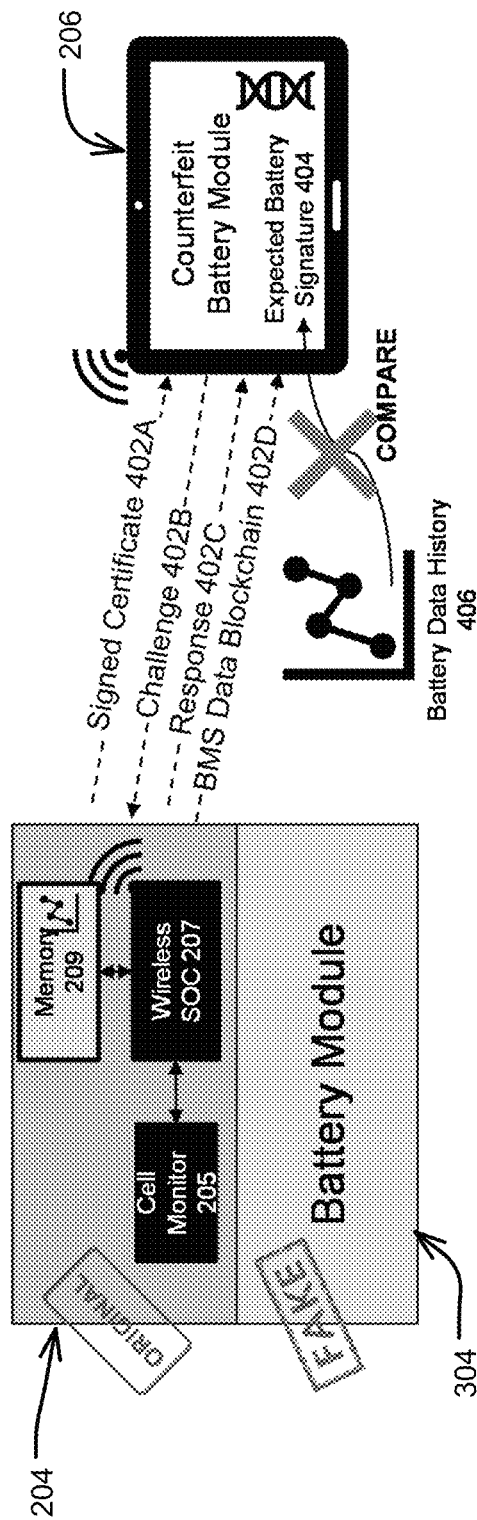
FIG. 4A
FIG. 4B

AUTONOMOUS BATTERY MONITORING SYSTEM

RELATED APPLICATIONS

This application claims the benefit under 35 U.S.C. § 119(e) of U.S. Provisional Application No. 63/078,846 entitled, "AUTONOMOUS BATTERY MONITORING SYSTEM," filed Sep. 15, 2020, which is incorporated by reference herein in its entirety.

FIELD

Described herein are systems and techniques of monitoring and verifying the identity of a battery at various stages during its lifecycle.

BACKGROUND

Batteries are used as a power source in various technologies. Batteries provide a mobile power source that can be used to power different types of devices such as electric vehicles, mobile devices (e.g., smartphones and tablets), and other types of devices.

A battery may convert chemical energy into electrical energy that can be used to power a device. As an illustrative example, a battery may include a cathode and an anode separated by an electrolyte. The material of the cathode and anode, and the electrolyte may be arranged to generate an electrical current that can be used to power a device. A battery may have a certain capacity to operate before it exhausts its chemical energy, and thus the electrical energy it can provide.

SUMMARY

Described herein is a device for autonomously monitoring a battery is provided. The device is integrated with the battery (e.g., by being electrically coupled to the battery). The device obtains measurement data by injecting electrical signals into the battery and measuring an electrical response of the battery. The device participates in an authentication protocol with a computing device to verify a unique identity of the device to the computing device. After performing the authentication protocol verifying the unique identity of the device, the device transmits battery data to the computer. Further, techniques for verifying the identity of the battery using measurement data obtained by the device are described herein. The techniques generate a battery signature using the measurement data that is then used to verify the identity of the battery from electrical characteristics of the battery. For example, the battery signature may be used to determine whether the battery is counterfeit or defective.

According to some embodiments, a system for verifying an identity of a battery integrated with a monitoring device is provided. The system comprises: a processor; and a non-transitory computer-readable storage medium storing instructions that, when executed by the processor, cause the processor to: after a first performance of an authentication protocol verifying a unique identity of the monitoring device, receive first data obtained by the monitoring device, wherein the first data comprises first measurement data obtained by the monitoring device or a first set of data generated from the first measurement data, wherein the first measurement data comprises a first measurement of an electrical response of the battery to a first one or more electrical signals injected by the monitoring device; obtain a first battery signature using the first data obtained by the monitoring device, wherein the first battery signature comprises a plurality of values indicative of electrical characteristics of the battery; and verify the identity of the battery using the first battery signature at least in part by determining whether the electrical characteristics of the battery match those of a reference battery.

According to some embodiments, a method for verifying an identity of a battery integrated with a monitoring device is provided. The method comprises: using a processor to perform: after a first performance of an authentication protocol verifying a unique identity of the monitoring device, receiving first data obtained by the monitoring device, wherein the first data comprises first measurement data obtained by the monitoring device or a first set of data generated from the first measurement data, wherein the first measurement data comprises a first measurement of an electrical response of the battery to a first one or more electrical signals injected by the monitoring device; obtaining a first battery signature using the first data obtained by the monitoring device, wherein the first battery signature comprises a plurality of values indicative of electrical characteristics of the battery; and verifying the identity of the battery using the first battery signature at least in part by determining whether the electrical characteristics of the battery match those of a reference battery.

According to some embodiments, a device integrated with and configured to autonomously monitor a battery is provided. The device comprises: a sensor; wireless communication circuitry; a processor; and a non-transitory computer-readable storage medium storing instructions that, when executed by the processor, cause the processor to: perform a first measurement on the battery using the sensor to obtain first measurement data at least in part by injecting a first one or more electrical signals into the battery and measuring an electrical response of the battery using the sensor, wherein the first measurement data indicates electrical characteristics of the battery integrated with the monitoring device; performing, using the wireless communication circuitry, an authentication protocol with a computing device, separate from the device, wherein performance of the authentication protocol verifies a unique identity of the device to the computing device; and after performing the authentication protocol with the computing device, transmit, using the wireless communication circuitry, the first measurement data or a first set of data generated from the first measurement data to the computing device.

BRIEF DESCRIPTION OF THE DRAWINGS

Various aspects and embodiments will be described herein with reference to the following figures. It should be appreciated that the figures are not necessarily drawn to scale. Items appearing in multiple figures are indicated by the same or a similar reference number in all the figures in which they appear.

FIG. 4A illustrates a battery identity verification sequence resulting in identification of a battery as being authentic, according to some embodiments of the technology described herein.

FIG. 4B illustrates a battery identity verification sequence resulting in identification of the battery as a counterfeit, according to some embodiments of the technology described herein.

DETAILED DESCRIPTION

Figure 1:
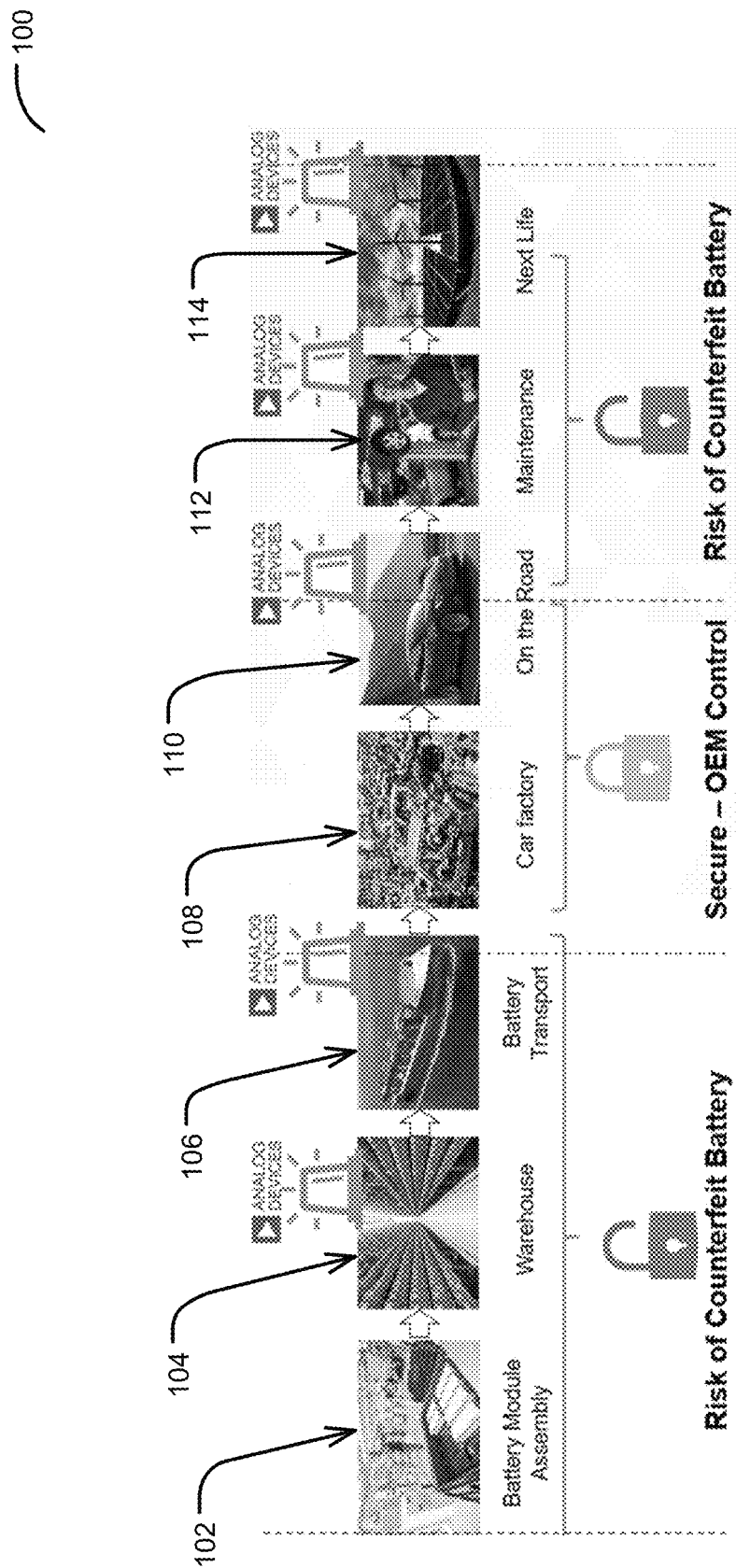
FIG. 1 illustrates examples of the stages of a battery lifecycle at which aspects of the present technology may be used to verify the identity of a battery.

Aspects of the present application provide methods and apparatuses for verifying the identity of a battery at various stages during its lifecycle. A battery may go through many stages in its lifecycle, involving different uses and/or locations. For example, the lifecycle may include storage (e.g., at a warehouse), transportation (e.g., on a ship), installation of the battery (e.g., at a factory) on a product (e.g., an electric vehicle), operation of the battery in the product, maintenance of the battery (e.g., while installed on the product or temporarily removed), and repurposing of the battery for another product or application. Securely identifying the battery during such stages may be desirable. Yet, the inventors have recognized that existing systems for monitoring batteries are unable to reliably detect during a battery's lifecycle: (1) whether the battery is counterfeit (e.g., due to installation of a counterfeit module or cell); and/or (2) whether the battery is defective. Existing systems may rely on measurement equipment external to the battery and/or a laboratory to perform testing on the battery. Thus, it is physically impractical to test the battery at many points during its lifecycle (e.g., in a warehouse, or on a ship) with existing systems.

As an illustrative example, a supply of batteries may be stored in a warehouse after assembly (e.g., before being shipped and installed on a product). In some instances, this storage period may represent an extended period of time, such as being between one month to one year, or even longer. The inventors have recognized that, during this storage period, there is a risk of an authentic battery being replaced with a counterfeit. More generally, counterfeits may be introduced to the warehouse supply without replacing an authentic battery. Existing monitoring systems can fail to detect such counterfeiting activity, meaning that a counterfeit battery can progress through the supply chain and cause significant harm and/or financial loss to the battery owner, manufacturer, distributor, or others. As another example, a battery may be defective, but the defect may not be detected with existing monitoring systems until the battery is at a stage of its lifecycle in which the defect is problematic, for instance causing harm or significant financial loss.

Accordingly, the inventors have developed a monitoring device that may be integrated with a battery and which detects a battery signature generated from electrical characteristics of the battery. The battery signature may be unique to a physical and/or chemical composition of the battery. The battery signature may differentiate the battery from other batteries based on its physical and/or chemical composition. In some embodiments, the battery signature may be unique to a given battery and thus may differentiate that battery from all other batteries. In some embodiments, the battery signature may be common to batteries within a batch of batteries (e.g., 2, 3, 4, 5, 10, 20, 30, 40, 50 100, 500, 1000 batteries) but unique for batteries within that batch as compared to batteries outside of the batch. For example, batteries within a batch may share the same composition and may have a common signature based on composition, but the signature may differentiate batteries within that batch from batteries that are not in that particular batch. In some embodiments, the battery signature may comprise of a portion that is common with a batch of batteries, and a portion that is unique to a given battery. The monitoring device may obtain measurements of the battery at various points during its lifecycle. The measurements may involve injecting electrical signals into the battery and measuring a response. For example, the monitoring device may obtain impedance measurements by performing electrochemical impedance spectroscopy (EIS) at one or more frequencies, and the resulting measurements may reflect a battery signature identifying the battery. In some embodiments, the monitoring device may monitor the battery during its lifecycle, repeatedly detecting the battery signature and thus allowing for verification of the battery.

The monitoring device may take various suitable forms. For example, the monitoring device may include a system on chip (SoC) with a unique identity (e.g., a cryptographic key) and with a processor (e.g., a microcontroller) that can execute software applications for performing measurements on the battery (e.g., using a sensor). The monitoring device may be physically attached to and integrated with the battery, and perform measurements on the battery (e.g., by injecting electrical signals into the battery). The monitoring device may obtain measurements without external measurement equipment. This allows the monitoring device to test the battery at regular intervals during its lifecycle. For example, the monitoring device may obtain measurements while the battery is stored at a warehouse without using any external measurement equipment.

The combination of the unique identity of the monitoring device (e.g., a cryptographic key) with a battery signature that indicates electrical characteristics of the battery provides a root of trust that can be used to securely identify the battery through its life. Thus, the root of trust may be used to verify the battery's identity during various stages of its lifecycle (e.g., during transportation, storage, use in a first product, and/or in a subsequent life of the battery). For example, the root of trust may be used to determine whether a counterfeit cell has been introduced into a battery, or if a cell is otherwise defective.

The inventors have further developed techniques that use measurement data obtained by the monitoring device in conjunction with the unique identity of the monitoring device to verify that the identity of the battery integrated with the device matches a reference battery. The techniques use measurement data obtained by the monitoring device to generate a battery signature. For example, the techniques may use measurements obtained from performing electrochemical impedance spectroscopy (EIS) by the monitoring device to generate the battery signature. Some embodiments compare a generated battery signature to an expected signature of the reference battery to verify the identity of the battery. A battery signature generated from a counterfeit battery (e.g., once including lower quality cell(s) or one from a different manufacturer) may be different from the expected signature. In some embodiments, if the measured battery signature deviates beyond a threshold amount from an expected signature, the battery may be identified as counterfeit or defective. Some embodiments of techniques described herein may store battery data on a blockchain for public verification. For example, the techniques may store encrypted measurement data and/or an encrypted battery signature on the blockchain to be validated by multiple different computing devices.

The reference battery may take multiple forms. In some embodiments, the reference battery may be a battery model expected to be integrated with the monitoring device. For example, the battery model may be a model of a battery that was integrated with the monitoring device during manufacturing of the battery. The battery signature generated from the measurement data can be compared to an expected battery signature at intervals during the lifecycle of the battery. The expected battery signature may have been generated by performing tests on one or more batteries of the same model as the battery expected to be integrated with the device and/or based on previously collected measurements from batteries of the model. In some embodiments, the reference battery may be a digital model of a battery. For example, the digital model of the battery may include parameters indicative of electrical characteristics of the battery. In some embodiments, the digital model of the battery may be generated by computer generated simulations of the battery.

FIG. 1 shows an example battery lifecycle 100. As shown in FIG. 1, the battery lifecycle begins with a stage 102 of assembly of a battery (e.g., a battery module). At stage 102, the battery may be manufactured by a battery manufacturer. After the stage 102 of assembly, the battery moves to a stage 104, in which the battery is stored in a warehouse for a period of time. In some instances, the battery may be stored for an extended period of time (e.g., one or more months or years). After the stage 104, the battery enters a stage 106 in which the battery is transported. For example, the battery may be transported in the stage 106 by a vehicle, ship, airplane, or other method of transportation. After transportation, the battery enters a stage 108 in which the battery is installed in a product. In the example of FIG. 1, the battery is installed into a car (e.g., an electric vehicle) at a factory or manufacturing plant. After being installed into a product, the battery enters a stage 110 in which the battery is used to power a device. In the example of FIG. 1, the battery powers an electric vehicle (e.g., an electric car). The battery also enters a stage 112 in which the product and/or the battery undergoes maintenance. For example, an electric vehicle having the battery installed therein, may be taken to a service center for regular maintenance during the life of the electric vehicle and/or to address issues with the vehicle.

After being used to power a device, the battery may have a second life 114 in which the battery is used to power a different device. In the example of FIG. 1, in the second life 114, the battery is used in a solar and wind energy plant.

During the lifecycle 100 of the battery, there may be various times during which the battery is at risk of being counterfeited (e.g., by having unauthorized cells installed in the battery). In the example of FIG. 1 there may be risk of the battery being counterfeited during stages 102-106, during which the battery may not be monitored while being physically accessible. For example, while the battery is stored in a warehouse in the stage 104, one or more cells in the battery may be replaced with counterfeit cell(s). In stages 108-110, there may be a lower risk of counterfeiting. For example, during installation and subsequent use in an electrical vehicle, the risk of counterfeiting may be low since the battery is under the control of the OEM or integrated with the vehicle. However, in stage 112 when the battery undergoes maintenance it may be susceptible to counterfeiting. For example, when an electric vehicle is being serviced, the battery may be accessible and thus there is a risk of a counterfeit battery being introduced. For example, a battery cell may be replaced with a counterfeit cell by someone unauthorized to service an electric vehicle.

A monitoring device integrated with an assembled battery may be used to verify the identity of the battery at regular intervals (e.g., to confirm that a counterfeit battery is not installed). For example, the battery identity may be verified every day, every week, every month, and/or at another interval. Thus, as shown in the example of FIG. 1, the battery may be verified while the battery is stored at a warehouse, being transported, in use by the user (e.g., in a vehicle), undergoing maintenance, and/or in a subsequent life.

The monitoring device may perform measurements on the battery. In some embodiments, the monitoring device may perform measurements (e.g., EIS measurements) at regular intervals. The monitoring device may perform measurements by measuring an electrical response of the battery to one or more electrical signals injected into the battery by the monitoring device. The monitoring device may store measurement data collected from performing the measurements (e.g., in a memory of the monitoring device). The measurement data may then be used to generate a battery signature (e.g., by the monitoring device or another computing device) that indicates electrical characteristics (e.g., impedance characteristics) of the battery. The battery signature may be used to verify whether the battery has electrical characteristics that match those of a reference battery.

Figure 2:
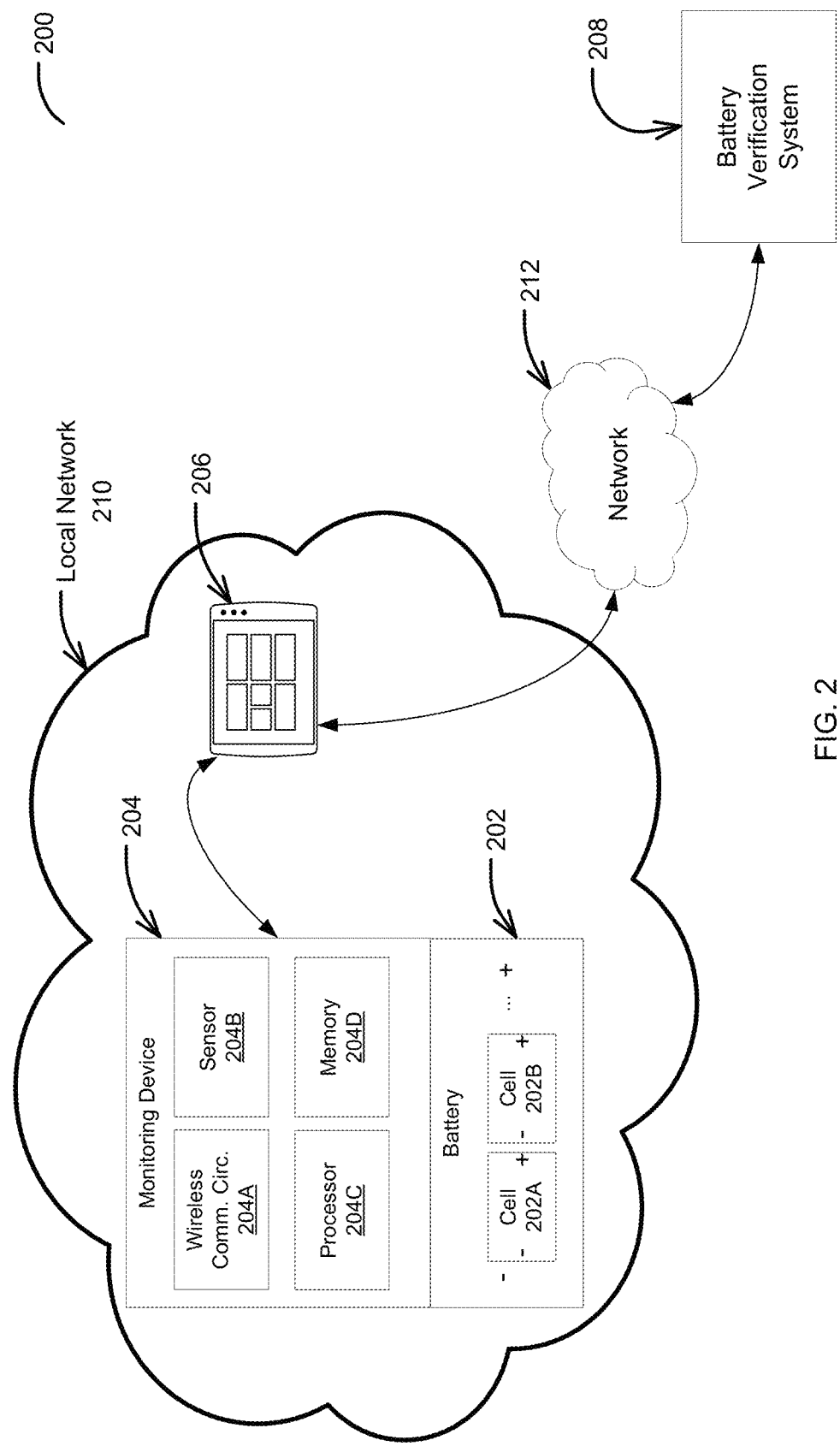
FIG. 2 illustrates a battery monitoring system in which some embodiments of the technology described herein may be implemented.

FIG. 2 illustrates an example system 200 implementing embodiments of the technology described herein. The system 200 includes a battery 202, a monitoring device 204, a computing device 206, and a battery verification system 208.

In some embodiments, the battery 202 may include external connections for powering electrical devices such as a light, a mobile device (e.g., a smartphone or tablet), an electric vehicle, or other suitable device. As shown in FIG. 2, the battery 202 includes a positive terminal (also referred to as a "cathode") and a negative terminal (also referred to as an "anode"). The negative terminal may mark a source of electrons that flow through an external circuit (e.g., of a device) to the positive terminal of the battery 202 when the battery 202 is connected to the device. The battery 202 delivers electrical energy to the device connected to the battery 202.

As shown in FIG. 2, the battery 202 includes one or more cells such as cells 202A and 20B. A cell may refer to a single anode and cathode separated by an electrolyte in the battery. The cell may be configured to output electrical energy (e.g., a voltage and/or current) by charging and discharging. For example, the cell may be a unit of a lithium ion battery including a cathode, anode, separator, and an electrolyte. Although in the example of FIG. 2, the battery 202 includes multiple cells, in some embodiments, the battery 202 may have a single cell.

The battery 202 may be any suitable type of battery. In some embodiments, the battery 202 may be an alkaline battery, a lithium battery, a mercury battery, a zinc air battery, a lithium ion battery, a lead acid gel battery, a nickel cadmium battery, a nickel metal hydride battery, a lithium ion battery, a nickel iron battery, a flooded lead acid battery, a lead acid battery, or any other suitable type of battery. In some embodiments, the battery 202 may be a rechargeable battery. In some embodiments, the battery 202 may be a non-rechargeable battery.

As shown in FIG. 2, the monitoring device 204 includes a processor 204C and memory 204D. In some embodiments, the monitoring device 204 may include a system on chip (SoC). The memory 204D may be configured to store instructions that can be executed by the processor 204C. For example, the memory 204D may store instructions of a software application that, when executed by the processor 204C, causes the processor 204C to obtain measurements of the battery 202 (e.g., using sensor 204B). The processor 204C may be configured to store measurement data in the memory 204D. In some embodiments, the software application may cause the monitoring device 204 to perform measurements at periodic time intervals. For example, the software application may cause the monitoring device 204 to perform a measurement every hour, every 12 hours, every day, every week, every month, every year, or at any other suitable frequency.

In some embodiments, the monitoring device 204 may be configured to have a unique identity. In some embodiments, the unique identity may be provided by a cryptographic key (also referred to herein as "key") that is unique to the monitoring device 204. For example, the monitoring device 204 may store the cryptographic key in memory of the monitoring device 204. The cryptographic key may be assigned to the monitoring device 204. For example, the cryptographic key may be assigned to the monitoring device 204 when the monitoring device 204 is integrated with the battery 202 in an assembly stage (e.g., in a battery back housing the battery 202 and the monitoring device 204).

The monitoring device 204 may be configured to use the key to perform one or more processes. For example, the monitoring device 204 may use the key to encrypt data (e.g., measurement data) and/or decrypt data (e.g., communications from another device). In another example, the monitoring device 204 may use the key to load a software application (e.g., for performing measurements on the battery 202). In some embodiments, the monitoring device 204 may be configured to use the key to perform an authentication protocol that verifies an identity of the monitoring device 204 to a system. As an illustrative example, the system may send a challenge to the monitoring device 204. The monitoring device 204 may generate a response to the challenge using a key (e.g., to decrypt data in the challenge or to sign a response). The response generated by the monitoring device 204 may be used by the system to verify the identity of the monitoring device 204.

As shown in FIG. 2, the monitoring device 204 may be integrated with the battery 202. In some embodiments, the monitoring device 204 may be integrated with the battery 202 by being mechanically attached to a battery pack housing the battery 202 or to the battery 202 itself. For example, the monitoring device 204 may be a system on chip (SoC) that is mechanically attached to the battery 202 or pack enclosing the battery 202. In some embodiments, the monitoring device 204 may be connected to a cathode and anode of the battery 202. The monitoring device 204 may be connected to the battery in a manner suitable for performing the desired measurements of the battery. For example, the monitoring device 204 may perform electrical measurements of the battery 202 using the connection (e.g., by injecting an electrical current through the connection and measuring a voltage of the battery 202). For example, when connected to the cathode and anode of the battery, the monitoring device may use the connection to the cathode and anode to perform measurements on the device. For example, the monitoring device 204 may inject electrical signals into the battery 202 through a connection to the cathode and/or anode of the battery 202.

In some embodiments, the monitoring device 204 may be integrated with the battery 202 during assembly of the battery 202. For example, a battery manufacturer may attach the monitoring device 204 to the battery 202 during manufacture. The monitoring device 204 may then be used to monitor the battery 202 through a lifecycle of the battery 202. The monitoring device 204 may have a unique identity (e.g., a key) assigned to the monitoring device 204. The unique identity may serve as a root of trust for authenticating the monitoring device 204 during its lifecycle. For example, a key stored on the monitoring device 204 during assembly may be used to authenticate the monitoring device 204. As an illustrative example, a system (e.g., computing device 206) external to the monitoring device 204 may perform a challenge response authentication protocol with the monitoring device 204 in which the monitoring device 204 generates a response a challenge using the key stored on the monitoring device 204 (e.g., by using the key to perform cryptographic encryption and/or decryption and/or sign the response).

As shown in FIG. 2, the monitoring device 204 includes a sensor 204B configured to perform measurements on the battery 202. For example, the sensor 204B may be a voltage sensor, current sensor, or impedance sensor. The sensor 204B may be configured to measure voltage and/or current of the cells 202A, 202B of the battery 202. In some embodiments, the monitoring device 204 may be configured to use the sensor 204B to perform measurements on the battery 202. The monitoring device 204 may be configured to: (1) inject one or more electrical signals into the battery 202; and (2) use the sensor 204B to measure an electrical response of the battery 202 to the electrical signal(s). As an illustrative example, the monitoring device 204 may perform electronic impedance spectroscopy (EIS) measurements on the battery 202 using the sensor 204B. In this example, the monitoring device 204 may inject electrical signals of varying frequency into the battery 202 and use the sensor 204B to measure an electrochemical impedance of the battery 202 at different frequencies. The impedance of the battery 202 at the different frequencies may indicate electrical characteristics of the battery 202. For example, the impedance of the battery 202 at the different frequencies may be used to generate a signature of the battery. As another example, the monitoring device 204 may perform voltage and/or current measurements on the battery 202 while charging and/or discharging the battery 202. As another example, the monitoring device 204 may inject electrical signal(s) into the battery 202 at one or more temperatures (e.g., ambient temperature, 0, 5, 10, 15, 20, 25, 30, 35, 40, 45, or 50 degrees Celsius), and use the sensor 204B to measure electrochemical impedance of the battery 202 at the temperature(s).

The sensor 204B may require electrical power to operate. In some embodiments, the sensor 204B may be powered by the battery 202. In some embodiments, the sensor 204B may be powered by a separate power supply. In some embodiments, the sensor 204B may have a low power state (also referred to as a "sleep mode"). In the lower power state, the sensor 204B may be configured to use a lower amount of electrical energy than in a high power state (also referred to as an "awake mode"). As an illustrative example, the sensor 204B may use a current of approximately 6 µA when in a sleep mode and a current of approximately 1 mA when performing a measurement in an awake mode.

As shown in FIG. 2, the monitoring device 204 includes a wireless communication circuit 204A. In some embodiments, the wireless communication circuit 204A may be a radio transceiver that allows the monitoring device 204 to communicate with one or more devices (e.g., computing device 206) within a range of the monitoring device 204. In some embodiments, the monitoring device 204 may be implemented as a component of a system on chip (SoC) (e.g., that also includes the sensor 204B). The wireless communication circuit 204A may be configured to communicate in a local network (e.g., network 210) of. The wireless communication circuit 204A may be configured to transmit data to and/or receive data from an external system (e.g., computing device 206). In some embodiments, the wireless communication circuit 204A may be configured to transmit and receive data in packets (e.g., network packets). For example, the wireless communication circuit 204A may transmit and receive data over one or more radio frequencies.

The wireless communication circuit 204A may be configured to communicate with other systems. In some embodiments, the wireless communication circuit 204A may be limited to communication with one or more other systems in a local network 210 of the monitoring device 204A. For example, the wireless communication circuits 204A may be limited to communicating with devices that are within a threshold distance (e.g., 10 feet, 20 feet, 30 feet, 40 feet, 50 feet, 100 feet, 500 feet, 1000 feet, 2000 feet, 5000 feet, 10000 feet, or other distance) of the monitoring device 204. In some embodiments the local network 210 may be a wireless local area network (WLAN). For example, the WLAN may include a router configured to transmit and receive data over radio frequencies. In some embodiments, the local network 210 may be a communication connection between the wireless communication circuit 204A and an external system (e.g., computing device 206). In some embodiments, the local network 210 may be a communication network including monitoring device 204, one or more other monitoring devices (e.g., integrated with other batteries), and/or one or more devices (e.g., computing device 206) within the local network 210.

In some embodiments, the monitoring device 204 may be configured to operate in multiple states. The multiple states may include a lower power state ("sleep state" or "dormant state") and a high power state. The monitoring device 204 may be configured to wake up from its sleep state to perform measurements. For example, the monitoring device 204 may automatically wake up at regular intervals (e.g., every day, every week, or every month) and perform measurements. The monitoring device 204 may include a software application that schedules measurements performed by the monitoring device 204. For example, the software application, when executed by the monitoring device 204, may cause the monitoring device to wake up from a sleep state and perform an EIS measurement on the battery.

The computing device 206 may be any suitable computing device. In some embodiments, the computing device 206 may be a mobile device. For example, the computing device 206 may be a smartphone, tablet, laptop, or other type of mobile device. In some embodiments, the computing device 206 may be a desktop computer, a server, or other type of computing device. In some embodiments, the computing device 206 may be a network hub or gateway configured to communicate with the monitoring device 204. For example, the computing device 206 may be a gateway located in a warehouse that is configured to periodically communicate with the monitoring device 204 (e.g., to obtain measurement data and/or data generated therefrom from the monitoring device 204). The computing device 206 may communicate with the monitoring device 204 once every hour, every 12 hours, every day, every week, every month, every 6 months, every year, or at any other suitable frequency.

In some embodiments, the computing device 206 may be configured to obtain, from the monitoring device 204, measurement data and/or data generated using measurement data. For example, the computing device 204 may receive network packets including data from the monitoring device 204. In some embodiments, the computing device 206 may be configured to authenticate an identity of the monitoring device 204. In some embodiments, the computing device 206 may be configured to authenticate the identity of the monitoring device 204 by verifying that the monitoring device 204 has stored thereon a cryptographic key (e.g., in the memory 204D). For example, the computing device 206 may perform an authentication protocol to verify that the monitoring device 204 has the cryptographic key. In some embodiments, the cryptographic key may be one of a symmetric key pair. The computing device 206 may have a first one of the symmetric key pair and the monitoring device 204 may have a second one of the symmetric key pair. In some embodiments, the cryptographic key may be one of an asymmetric key pair in which the computing device 206 has a public key of the asymmetric key pair and the monitoring device 204 has a private key of the asymmetric key pair.

In some embodiments, the battery verification system 208 may be a computing device. For example, the computing device may be a desktop, laptop, server, smartphone, tablet, or any other suitable computing device. The battery verification system 208 may be configured to perform verification of the battery 202. The battery verification system 208 may be configured to perform verification of the monitoring device 204 in addition to verification of the battery 202.

In some embodiments, the battery verification system 208 may be configured to verify that the battery 202 that the monitoring device 204 is integrated with is authentic. The battery verification system 208 may be configured to verify that the battery 202 is not a counterfeit battery. For example, the battery verification 208 may verify that the battery 202 is one that was integrated with the monitoring device 204 during assembly (e.g., stage 102 of FIG. 1). In another example, the battery verification system 208 may verify that cells of the battery 202 are those manufactured by an OEM. In some embodiments, the battery verification system 208 may be configured to verify that the battery 202 is not a defective battery. For example, the verification system 208 may verify that the cells of the battery 202 is operating according to a specification of the battery.

In some embodiments the battery verification system 208 may be configured to verify the battery 202 using a battery signature that indicates electrical characteristics of the battery. The battery signature may include values indicating the electrical characteristics of the battery. For example, the battery signature may include impedance measurements of the battery for various electrical signal frequencies. In another example, the battery signature may include values of a charge or discharge curve of the battery. The battery verification system 208 may be configured to verify the identity of the battery 202 by determining whether the electrical characteristic of the battery match those of a reference battery.

In some embodiments, the battery verification system 208 may be configured to verify the identity of the battery 202 using the battery signature. The battery verification system 208 may be configured to verify the identity of the battery 202 using the battery signature by comparing the battery signature to an expected battery signature. The expected battery signature may represent expected electrical characteristics of a battery that the monitoring device 204 is expected to be integrated with. For example, the expected battery signature may include expected battery impedance values at various frequencies. When the battery verification system 208 determines that the battery signature is different from the expected battery signature, the battery verification system 208 may determine that the battery 202 is a counterfeit and/or defective. When the battery verification system 208 determines that the battery signature matches the expected battery signature, the battery verification system 208 may determine that the battery 202 is not a counterfeit battery and/or that the battery 202 is not defective.

In some embodiments, the battery verification system 208 may be configured to generate the battery signature using measurement data obtained by the monitoring device (e.g., received from computing device 206 through network 212). In some embodiments, the battery verification system 208 may be configured to generate the battery signature to be one or more values of the measurement data. For example, the battery verification system 208 may generate the battery signature to be impedance values obtained of EIS measurement data. As another example, the battery verification system 208 may generate the battery signature to be a series of electrical current values of a measured charge or discharge curve of the battery. In some embodiments, the battery verification system 208 may be configured to generate the battery signature by compiling measurement values obtained at different points in time. The battery verification system 208 may be configured to compile the measurement values into a data structure. For example, the battery verification signature 208 may store the measurement values in a vector or matrix. The battery verification signature 208 may be configured to update the signature when new measurement data is received. In some embodiments, the battery verification system 208 may be configured to generate the battery signature by adding the measurement data to a blockchain. The battery verification system 208 may be configured to use the blockchain as the battery signature. For example, the battery verification system 208 may: (1) add obtained measurement data to a blockchain; and (2) determine whether the updated blockchain matches an expected blockchain. As an illustrative example, the battery verification system 208 may store impedance values collected from a measurement in a block of the blockchain.

In some embodiments, the battery signature may be generated by the monitoring device 204. The monitoring device 204 may be configured to generate the battery signature using measurement data obtained by performing a measurement on the battery 202. For example, the monitoring device 204 may generate a battery signature using measurement data obtained by performing an electronic impedance spectroscopy (EIS) measurement on the battery 202 (e.g., stored in memory 204D). The monitoring device 204 may be configured to generate the battery signature as described herein with reference to the battery verification system 208. The battery verification system 208 may be configured to receive a battery signature generated by the monitoring device 204 through network 212 from the computing device 206. The battery verification system 208 may be configured to use the generated battery signature to verify the identity of the battery 202. In some embodiments, the battery verification system 208 may be configured to verify the identity of the battery 202 by comparing the received battery signature to an expected battery signature.

In some embodiments, the network 212 may be a communication network through which the computing device 206 can communicate with the battery verification system 208. In some embodiments, the network 212 may be the Internet. As shown in FIG. 2, in some embodiments, the monitoring device 204 may not be configured to access the network 212. In another example, the network 212 may be a local area network (LAN). In another example, the network 212 may be a wide area network (WAN). In another example, the network 212 may be a cellular (e.g., 3G, 4G, and/or 5G) network.

The system 200 may be configured in different ways than what is shown in FIG. 2. Although in the example of FIG. 2 the battery verification system 208 is shown separate from the computing device 206, in some embodiments, the battery verification system 208 may be implemented on the computing device 206. For example, the computing device 206 within the local network 210 may be configured to generate a battery signature and/or verify the identity of the battery 202 using the battery signature. The battery verification system 208 may thus be implemented as a software module on the computing device 206.

Figures 3A, 3B:
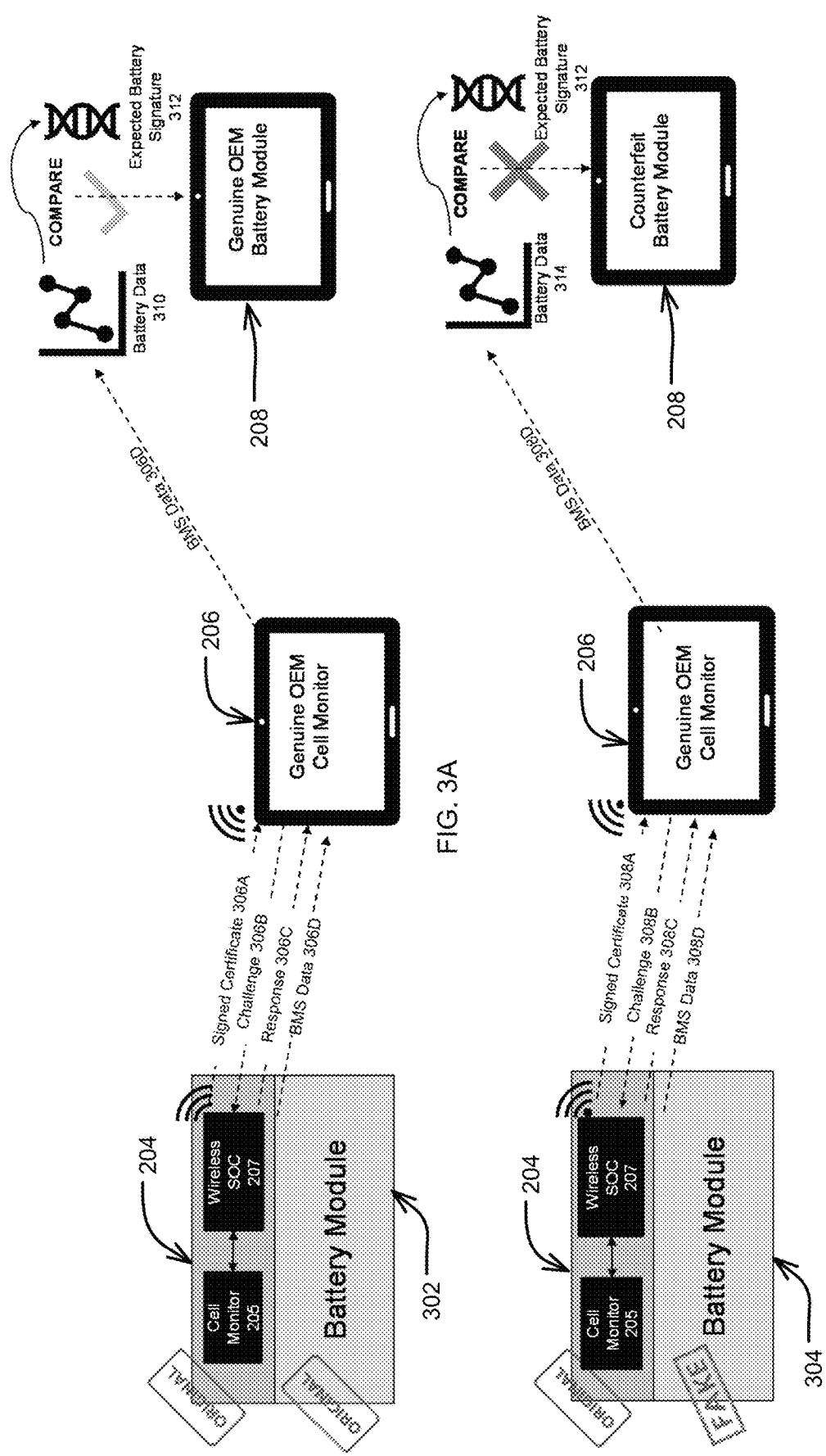
FIG. 3A illustrates a battery identity verification sequence resulting in identification of a battery as being authentic, according to some embodiments of the technology described herein.
FIG. 3B illustrates a battery identity verification sequence resulting in identification of the battery as a counterfeit, according to some embodiments of the technology described herein.

FIG. 3A illustrates a battery identity verification sequence resulting in identification of a battery as being authentic, according to some embodiments of the technology described herein. The battery module 302 shown in FIG. 3A may be the battery 202 that the monitoring device 204 was integrated with (e.g., during assembly of the battery 202 by a manufacturer). The monitoring device 204 includes a cell monitor 205 and a wireless system on chip (SOC) 207. The cell monitor may include the sensor 204B. The cell monitor 205 may be configured to perform measurements on a battery that the monitoring device 204 is integrated with. The wireless SOC 207 may include wireless communication circuit 204A, processor 204C, and memory 204D.

In the example of FIG. 3A, the monitoring device 204 performs an authentication protocol with the computing device 206 to verify a unique identity of the monitoring device 204 to the computing device 206. The computing device 206 may then obtain measurement data from the monitoring device 204 after verification of the identity of the monitoring device 204.

As shown in FIG. 3A, the authentication protocol begins with the monitoring device 204 sending a signed certificate to the computing device 206. The monitoring device 204 uses wireless communication circuitry 204A to transmit a signed certificate 306A to the computing device 206. The signed certificate 306A may establish a communication session between the monitoring device 204 and the computing device 206. In some embodiments, the signed certificate 306A may be a digital certificate signed digitally by the monitoring device 204. For example, the monitoring device 204 may have a cryptographic key (e.g., a public or private key) stored in its memory 204D that the monitoring device 204 uses to sign the digital certificate. The signed certificate 306A may establish a secure communication session with the computing device 206.

Once the secure communication session is established, the computing device 206 transmits a challenge 306B to the monitoring device 204. In some embodiments, the challenge 306B may include encrypted data (e.g., a random number, textual data, or other data) that the monitoring device 204 is required to decrypt to generate a response. For example, the challenge 306B may include an encrypted random number that the monitoring device 204 is to decrypt using a cryptographic key (e.g., a public key of a symmetric key pair, or a private key or an asymmetric key pair). In another example, the challenge 306B may include encrypted text (e.g., ciphertext). The monitoring device 204 may be configured to generate a response 306C to the challenge 306B. In some embodiments, the monitoring device 204 may be configured to generate the response 306C by decrypting the encrypted data (e.g., encrypted random number, or ciphertext) of the challenge 306B. The monitoring device 204 may be configured to generate the response 306C using a decryption of the encrypted data in the challenge 306B. For example, the monitoring device 204 may determine the response 306C to be a value resulting from calculating a function using decrypted obtained from decryption of the encrypted value of the challenge 306B. In another example, the monitoring device 204 may determine the response 306C to be a decrypted value obtained from decryption of an encrypted value of the challenge 306B.

After receiving the challenge 306B, the monitoring device 204 sends the response 306C to the computing device 206. The computing device 206 may be configured to verify an identity of the monitoring device 204 based on the response 306C. In some embodiments, the computing device 206 may be configured to verify the identity of the monitoring device 204 by determining whether the response 306C matches an expected response. For example, the computing device 206 may determine whether the response 306C includes a correct value (e.g., a correct decrypted value, or result of a function calculated therefrom). In another example, the computing device 206 may determine whether the response 306C includes an expected set of deciphered ciphertext that was included in the challenge 306B.

After verifying the identity of the monitoring device 204, the computing device 206 may receive data 306D from the monitoring device 204. In some embodiments, the monitoring device 204 may be configured to transmit measurement data obtained from performing one or more measurements (e.g., EIS measurement data) on the battery module 302. In some embodiments, the monitoring device 204 may be configured to transmit data generated from measurement data. For example, the monitoring device 204 may: (1) generate a battery signature using the measurement data; and (2) transmit the battery signature to the computing device 206. The data 306D that the monitoring device 204 transmits (e.g., measurement data and/or a battery signature) may be referred to herein as battery management system (BMS) data 306D.

The battery verification system 208 may be configured to generate battery data 310 using the BMS data 306D. In some embodiments, the battery data 310 may be a battery signature that the battery verification system 208 generates using BMS data 306D (e.g., measurement data). In some embodiments, the battery verification system 208 may be configured to generate the battery data 310 by combining the BMS data 306D with other information about the battery. For example, the battery verification system 208 may combine the BMS data 306D with previously received BMS data (e.g., from a previous verification). In another example, the battery verification system 208 may combine the BMS data 306D with an identifier of the battery to generate the battery data 310. In some embodiments, the battery data 310 may be a battery signature included in the BMS data 306D (e.g., generated by the monitoring device 204). The battery signature may indicate electrical characteristics (e.g., impedance characteristics, charge characteristics, discharge characteristics) of the battery module 302.

The battery verification system 208 verifies the identity of the battery module 302 to be authentic using the generated battery data 310. The battery verification system 208 may be configured to verify the identity of the battery module 302 by determining whether electrical characteristics of the battery module 302 indicated by a battery signature match those of a reference battery. For example, the battery verification system 308 may verify the identity of the battery module 302 by determining whether a battery signature (e.g., generated from or included in the BMS data 306D) matches an expected battery signature 312 of the reference battery.

FIG. 3B illustrates a battery identity verification sequence resulting in identification of the battery as a counterfeit, according to some embodiments of the technology described herein. The battery module 304 shown in FIG. 3B may be the battery 202 of FIG. 2, where one or more cells (e.g., cells 202A, 202B) of the battery 202 are replaced with counterfeit cell(s). The monitoring device 204 and the computing device 206 may perform the authentication protocol as described herein with reference to FIG. 3A. For example, the monitoring device may: (1) transmit a signed certificate 208A to the computing device 206 to establish a communication session; (2) receive a challenge 308B from the computing device 206; (3) generate and transmit a response 308C to the computing device 206; and (4) transmit BMS data 308D after the computing device 206 authenticates the monitoring device 204 based on the response 308C. The computing device 206 may obtain the BMS data 308D (e.g., measurement data and/or a battery signature) from the monitoring device 204, and transmit the BMS data 308D to the battery verification system 208.

The battery verification system 208 identifies the battery 304 as a counterfeit. The battery verification system 208 identifies the battery 304 as a counterfeit by determining that the electrical characteristics of the battery module 304 do not match those of a reference battery. As shown in FIG. 3B, the battery verification system 208 generates battery data 314 using the BMS data 308D received from the computing device 206. In some embodiments, the battery data 314 may be a battery signature generated by the battery verification system 208 using the BMS data 308D, or a battery signature included in the BMS data 308D (e.g., generated by the monitoring device 204). As shown in FIG. 3B, the battery verification system 208 determines that the battery signature does not match an expected battery signature 312 of a reference battery. For example, the battery verification system 208 determines that the battery signature does not match an expected battery signature 312 of the battery module 302 that the monitoring device 204 was integrated with during assembly. In this instance, the battery verification system 208 determines that the battery module 304 is counterfeit and/or defective.

In some embodiments, the computing device 206 may be configured to perform verification of the identity of the battery integrated with the monitoring device 204. Although in the examples of FIGS. 3A-3B the verification of the identity of the battery integrated with the monitoring device 204 is performed by a battery verification system 208 separate from the computing device 206, in some embodiments, the verification may be performed by the computing device 206. For example, the computing device 206 may include the battery verification system 208.

FIG. 4A illustrates a battery identity verification sequence resulting in identification of a battery as being authentic, according to some embodiments of the technology described herein. As shown in FIG. 4A, the monitoring device 204 transmits a signed certificate 400A to the computing device 206 to establish communication with the computing device 206. The monitoring device 204 may then perform an authentication protocol in which the monitoring device 204 receives a challenge 400B from the computing device 206, and transmits a response 400C to the computing device 206 as described herein with reference to FIG. 3A. The computing device 206 may use the response 400C provided by the monitoring device 204 to verify the identity of the monitoring device 204 as described herein with reference to FIG. 3A (e.g., to verify that the monitoring device 204 possesses a key).

As shown in FIG. 4A, the monitoring device 204 may be configured to store a BMS data blockchain 400D. In the example of FIG. 4A, the monitoring device 204 stores the BMS data blockchain 400D in memory 209 of the monitoring device 204. The memory 209 may be a component of memory 204D described of the monitoring device 204 described herein with reference to FIG. 2. In some embodiments, the BMS data blockchain 400D may be a blockchain of measurement data obtained by the monitoring device 204 by performing measurements (e.g., EIS measurements) on the battery module 302. For example, the BMS data blockchain 400D may store measurement data obtained at different times during the lifecycle of the battery module 302. In some embodiments, the BMS data blockchain 400D may be a blockchain of data generated using measurement data. For example, the BMS data blockchain 400D may be a blockchain of battery signatures generated by the monitoring device 204 using measurement data. For example, the BMS data blockchain 400D may store battery signatures generated at different times in the life of the battery module 302. The monitoring device 204 may be configured to generate the BMS data blockchain 400D by: (1) obtaining BMS data by performing measurements on the battery module 304; and (2) storing measurement data and/or data generated using the measurement data in a blockchain.

As shown in FIG. 4A, the monitoring device 204 transmits the BMS data blockchain 400D to the computing device 206. The BMS data blockchain 400D allows the computing device 206 to verify the identity of the battery module 302 that the monitoring device 204 is integrated with. For example, the computing device 206 may use the BMS data blockchain 400D to verify that the battery module 302 is one that the monitoring device 204 was integrated with during assembly. In some embodiments, the BMS data blockchain 400D provided by the monitoring device 204 may be a battery signature representing the battery module 302. The monitoring device 206 may be configured to compare the BMS data blockchain 400D to an expected battery signature 404 (e.g., an expected BMS data blockchain) to verify the battery module 302 (e.g., to verify that it is not a counterfeit and/or not defective).

FIG. 4B illustrates a battery identity verification sequence resulting in identification of the battery as a counterfeit, according to some embodiments of the technology described herein. The monitoring device 204 transmits a signed certificate 402A to the computing device 206 to establish a communication session. The monitoring device 204 then performs an authentication protocol in which the monitoring device 204 receives a challenge 402B, and transmits a response 402C to the computing device 206. The response may allow the computing device 206 to verify the identity of the monitoring device 204.

After verification of the identity of the monitoring device 204, the monitoring device 204 transmits a BMS data blockchain 402D stored in memory 209 of the monitoring device 204 to the computing device 206. The monitoring device 204 may be configured to generate the BMS data blockchain by: (1) generating BMS data by performing measurements on the battery module 304; and (2) storing the BMS data in a blockchain. In the example of FIG. 4B, the battery module 304 is a counterfeit of the battery module 302. For example, the battery module 304 may include one or more counterfeit cells. As such, when the computing device 206 compares the BMS data blockchain 402D received from the monitoring device 204 to an expected battery signature 404, the computing device 206 determines that the BMS data blockchain does not match the expected battery signature 404. The computing device 206 thus determines that the battery module 304 is a counterfeit and/or defective.

Although the example of FIGS. 4A-4B describe the computing device 206 performing verification of battery modules that the monitoring device 204 is integrated with, in some embodiments, the battery verification system 208 may be configured to perform the verification. For example, the computing device 206 may transmit the BMS data blockchain to the battery verification system 208 (e.g., over the Internet). The battery verification system 208 may be configured to verify the identity of the battery module (e.g., by comparing the BMS data blockchain to an expected battery signature).

Figure 5:
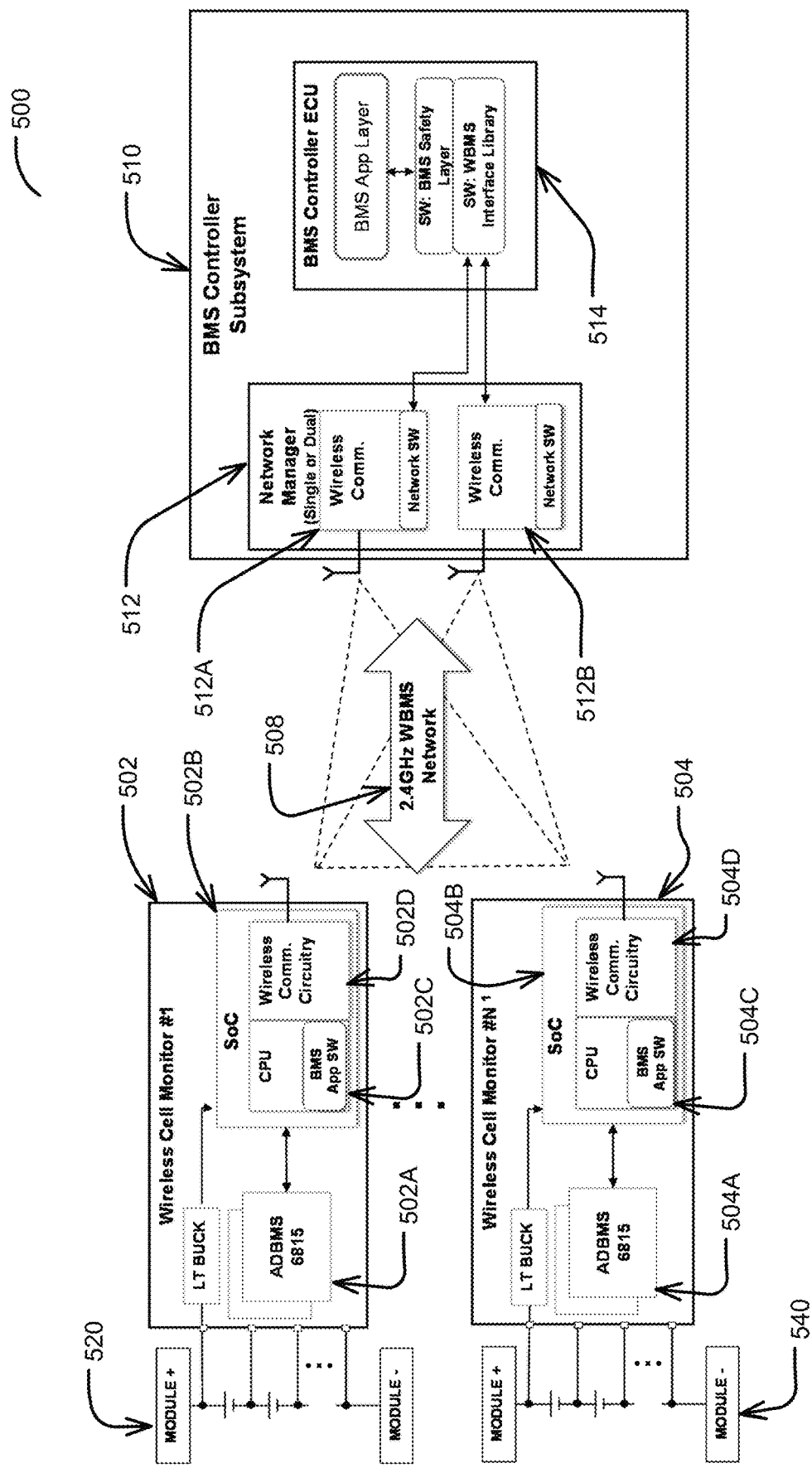
FIG. 5 illustrates an example system 500 incorporating batteries with integrated monitoring devices, according to some embodiments of the technology described herein.

FIG. 5 illustrates an example of a system 500 that includes multiple monitoring devices 502, 504 for monitoring respective batteries 520, 540, according to some embodiments of the technology described herein. For example, the system 500 may be an electric vehicle that includes batteries 520, 540 for powering the electric vehicle. Each of the monitoring devices 502, 504 may be monitoring device 204 described herein with reference to FIG. 2.

In the example of FIG. 5, the monitoring devices 502 includes a system on chip (SoC) 502A, and the monitoring device 504 includes a SoC 504B. The the SoCs 502B, 504B include respective central processing units (CPUs) 502C, 504C. Each of the CPUs 502C, 504C may be configured to execute instructions (e.g., of a software application). In the example of FIG. 5, each of the CPUs 502C, 504C is configured to execute a battery management system (BMS) software application. When BMS software application instructions are executed by a CPU, the CPU may use a sensor of the monitoring device to perform measurements on a battery integrated with the monitoring device and/or generate a battery signature using measurement data. In the example of FIG. 5, the monitoring devices 502, 504 include respective sensors ("ADBMS 6815" available from Analog Devices, Inc. of Wilmington, Massachusetts) 502A, 504A that may be used to perform measurements on respective batteries 520, 540.

The monitoring devices 502, 504 include respective wireless communication circuitry 502D, 504D. Each monitoring device may use the wireless communication circuitry to communicate with an external computing device. For example, the monitoring device may use the wireless communication circuitry to transmit BMS data to the external computing device. The CPU may be further configured to perform an authentication protocol with an external computing device (e.g., BMS controller subsystem 510) to authenticate an identity of the monitoring device to the external computing device.

As shown in FIG. 5, the system 500 includes a BMS controller subsystem 510. The BMS controller subsystem 510 includes a network manager 512 with wireless communication devices 512A, 512B for communicating with the monitoring devices 502, 504. The monitoring devices 502, 504 may be configured to communicate with the network manager over a local wireless battery management system (WBMS) network 508. In the example of FIG. 5, the network is a 2.4 GHz frequency network.

The BMS controller subsystem 510 includes an ECU 514. The ECU 514 is configured to execute customer battery management system (BMS) software. The BMS software application may provide indications of battery health and validity. The ECU 514 is configured to use a WBMS interface for interfacing with the network manager 512. The ECU may be configured to communicate with the monitoring devices 502, 504 through the WBMS interface (e.g., to obtain BMS data from the monitoring devices 502, 504). The ECU 514 of the BMS controller subsystem 510 is further configured to execute a BMS safety application layer. The BMS safety application layer may be configured to analyze data obtained from the monitoring devices 502, 504. For example, the BMS safety layer may verify batteries 520, 540 integrated with the monitoring devices 502, 504 using techniques described herein (e.g., to verify that the batteries 520, 540 are authentic). The ECU 514 of the BMS controller subsystem 510 is further configured to execute a customer BMS application layer. The BMS safety application layer may be configured to transmit information to a customer BMS application layer. For example, the BMS safety application layer may transmit battery verification information (e.g., counterfeit, valid, and/or defect indications) to the customer BMS application layer.

Figure 6:
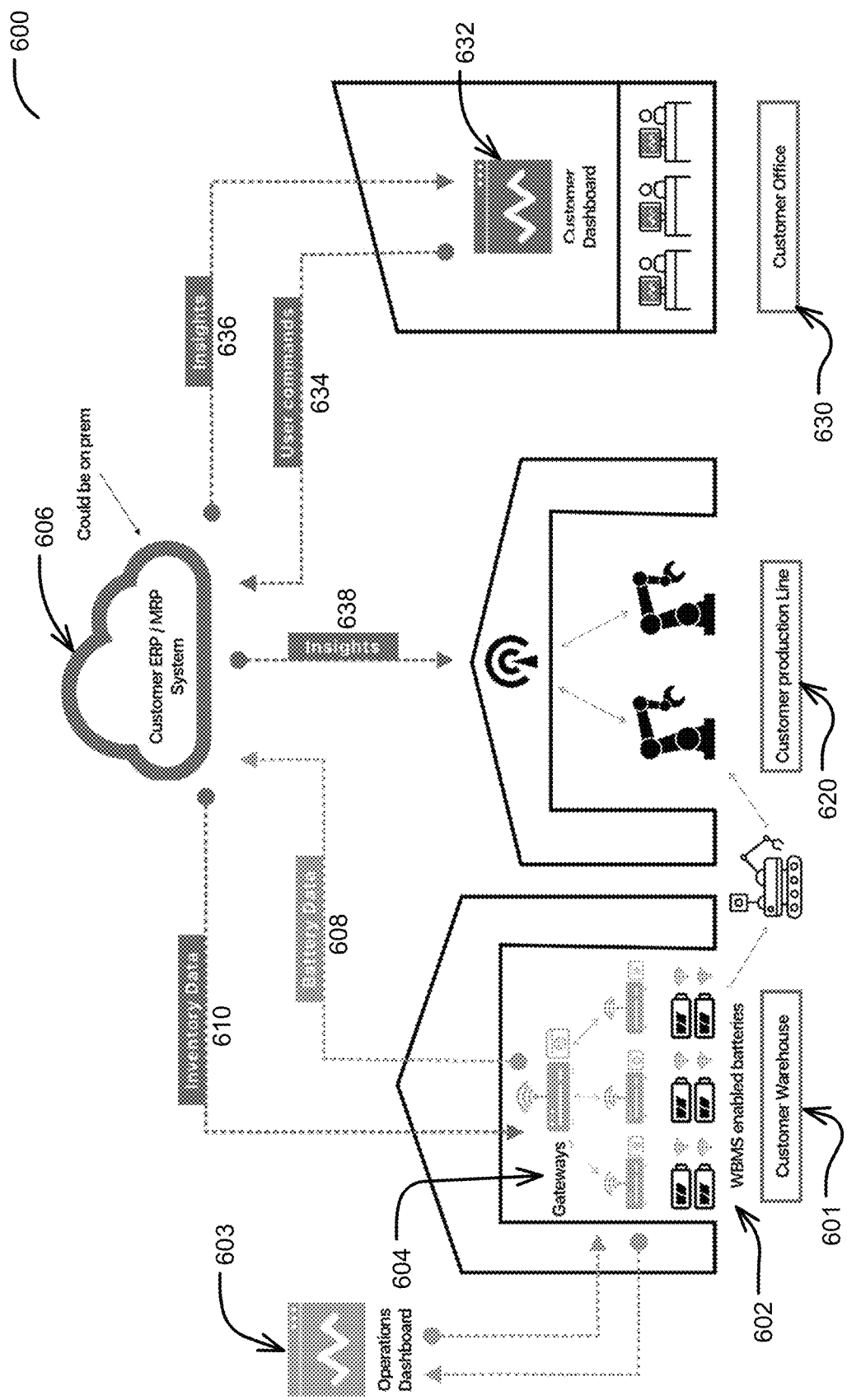
FIG. 6 illustrates a system data flow diagram in a cloud based battery monitoring infrastructure 600, according to some embodiments of the technology described herein.

FIG. 6 illustrates a system data flow diagram in a cloud based battery monitoring system (BMS) infrastructure 600, according to some embodiments of the technology described herein. The BMS infrastructure 600 includes multiple WBMS enabled batteries 602. A WBMS enabled battery may be one with a monitoring device (e.g., monitoring device 204) integrated with the battery. For example, the battery may have a monitoring device in a pack enclosing the battery, and be electrically coupled to the monitoring device (e.g., to allow the monitoring device to perform measurements on the battery). The monitoring devices of the batteries 602 may be configured to transmit BMS data (e.g., measurement data and/or battery signatures) to gateways 604 in a customer warehouse 601 where the batteries 602 are being stored. The gateway 604 may be configured to transmit the battery data 608 to a cloud computing enterprise resource planning (ERP) or material requirements planning (MRP) system 606.

In some embodiments, the battery verification system 208, described herein with reference to FIG. 2, may be implemented on the cloud computing system 606. The cloud computing system 606 may be configured to use the data 608 to verify the identities of the batteries and/or monitor the batteries (e.g., operation and performance). The cloud computing system 606 may be configured to transmit inventory data 610 to the gateways 604. For example, the inventory data 610 may include information about authenticity of the batteries 602 (e.g., determined using the battery data 608). As an illustrative example, the inventory data 610 may include one or more flags identifying one or more of the batteries 602 as including counterfeit cell(s).

The cloud computing system 606 may be configured to provide information to other systems. As shown in FIG. 6, the cloud computing system 606 may be configured to provide insights data 636 on a customer dashboard user interface 632 displayed by computing devices at a customer office 630. For example, the cloud computing system 606 may display battery verification information for batteries stored in the warehouse 601. The cloud computing system 606 may be configured to provide insights data 638 to a system associated with a customer production line 620. For example, the cloud computing system 606 may provide an indication of valid batteries available for installation on the production line 620. FIG. 6 also shows an operations dashboard 603 which may be used by a manufacturer of the monitoring devices. For example, the manufacturer may use the dashboard 603 to monitor operation of the monitoring devices integrated with the batteries.

Figure 8:
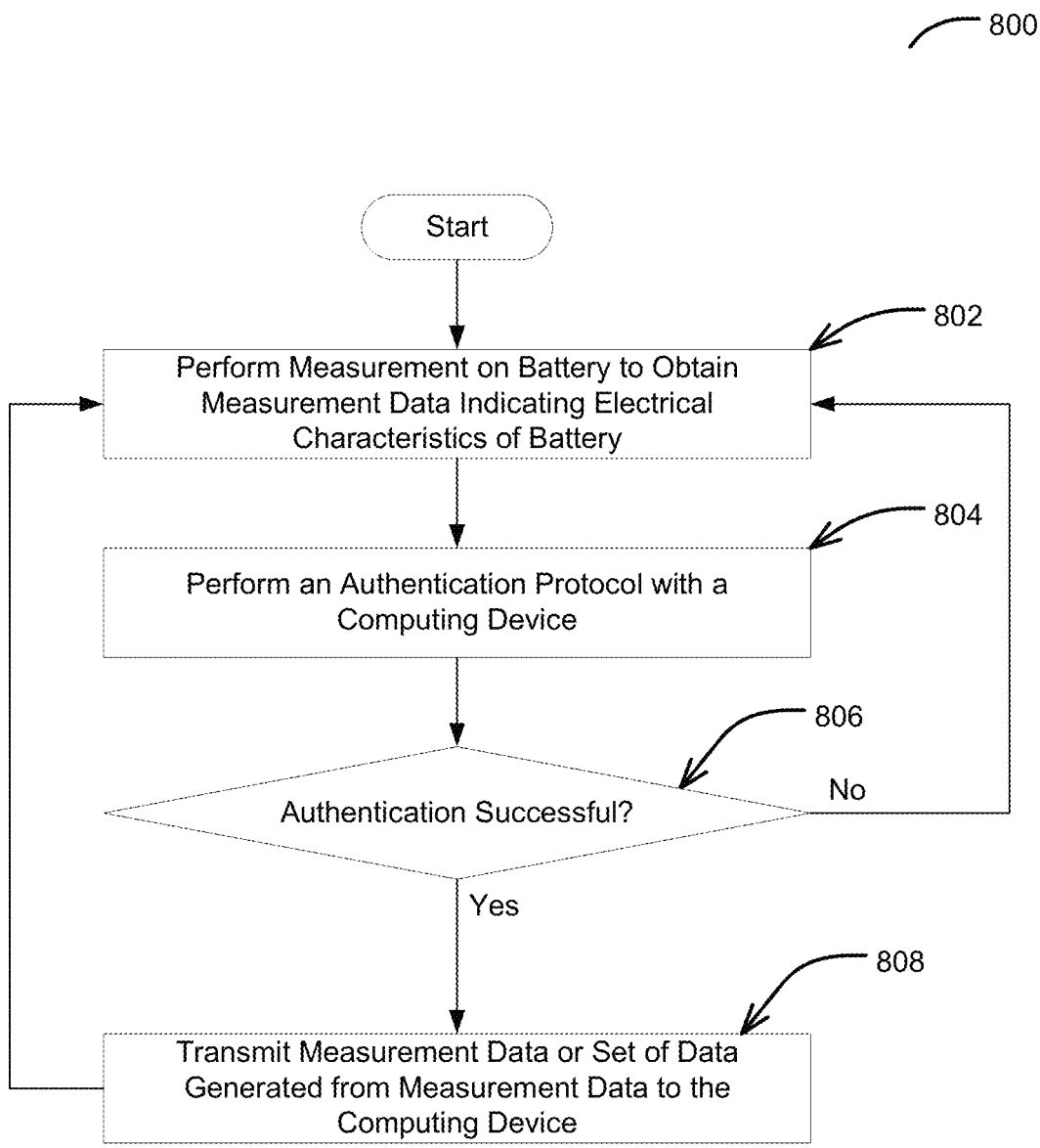
FIG. 8 illustrates a flowchart of an example process 800 of obtaining data by a monitoring device integrated with a battery, according to some embodiments of the technology described herein.

FIG. 8 illustrates a flowchart of an example process 800 of obtaining data by a monitoring device integrated with a battery, according to some embodiments of the technology described herein. Process 800 may be performed by monitoring device 204 described herein with reference to FIG. 2. As an illustrative example, process 800 may be performed by the monitoring device 204 to verify that a battery integrated with the monitoring device is one that was assembled by an OEM.

Process 800 begins at block 802, where the device (e.g., monitoring device 204) performs a measurement on a battery (e.g., battery 202) to obtain measurement data. In some embodiments, the device may be configured to perform the measurement on the battery by injecting one or more electrical signals into the battery and measuring an electrical response of the battery using a sensor. The measurement data may comprise a measurement of the electrical response of the battery to the electrical signal(s).

In some embodiments, the measurement may be an EIS measurement. The device may be configured to perform an EIS measurement on the battery by injecting multiple alternating current (AC) signals of different frequencies into the battery, and measuring an impedance response of the battery to the signals. The device may be configured to measure an impedance response of the battery to the different signals. The impedance response may be measured as two parameters: (1) resistance; and (2) reactance. The impedance response may be represented as a complex number. The total impedance may be calculated by determining a magnitude of the complex number. In some embodiments, the device may be configured to perform state of charge (SOC) measurement on the battery. For example, the device may perform the SOC measurement by measuring an open circuit voltage of the battery, and determining the SOC as a function of the open circuit voltage. In another example, the device may perform the SOC measurement by Coulomb counting to measure discharge of current of the battery.

In some embodiments, the measurement may be performed at one or more temperatures. The device may be configured to perform the measurement at the temperature(s) to determine an electrical response at the temperature(s). For example, the device may perform an EIS measurement at the temperature(s) to measure an impedance response of the battery at the temperature(s).

Next, process 800 proceeds to block 804, where the device performs an authentication protocol with a computing device (e.g., computing device 206). By performing the authentication protocol, the device may authenticate its identity to the computing device. The authentication may prove to the computing device that data received from the device performing process 800 can be trusted (e.g., because it is not from an adversarial entity). In some embodiments, the device may be configured to perform the authentication protocol by wirelessly communication with the computing device. For example, the device may transmit a signed certificate to the computing device to establish a secure communication (e.g., in a local network of the device performing process 800). In some embodiments, the device may be configured to perform an authentication protocol in which the device: (1) receives a challenge from the computing device; and (2) generates a response to the challenge. For example, the device may receive a challenge consisting of a value (e.g., a random number) encrypted using a key (e.g., a symmetric or asymmetric key). The device may generate the response to the challenge by: (1) decrypting the encrypted value (e.g., using a symmetric or asymmetric key); (2) determining a response value using the decrypted value (e.g., by calculating a value of a function using the decrypted value; and (3) transmitting the response value to the computing device. If the response value meets an expected value, the monitoring device may be authenticated (e.g., determined to be a trusted source of information) by the computing device. If the response value does not meet the expected value, the device may be determined to be tampered with or compromised to an adversary.

Next, process 800 proceeds to block 806, where the device determines whether authentication is successful. In some embodiments, the device may be configured to determine whether authentication is successful by receiving a communication from the computing device indicative of whether the authentication was successful. For example, the device may determine a binary value indicating whether a response transmitted to the computing device is correct (e.g., matches an expected value).

If at block 806, the device determines that authentication is successful, then process 800 proceeds to block 808, where the device transmits measurement data or set of data generated from the measurement data to the computing device. In some embodiments, the device may be configured to transmit measurement data to the computing device. For example, the device may transmit measured impedance values to the computing device. In some embodiments, the device may be configured to: (1) generate a battery signature (e.g., a blockchain of BMS data) using measurement data; and (2) transmit the generated battery signature. The transmitted measurement data or set of data (e.g., battery signature) generated from the measurement data may be used to verify the battery (e.g., by the computing device or a separate system). An example process of verifying the battery is described herein with reference to FIG. 9.

If at block 806, the device determines that authentication is unsuccessful, then process 800 proceeds to block 802. The device may not be allowed to subsequently transmit measurement data to the computing device. For example, the device may be determined to be compromised to an adversary or not to be a device installed by an OEM.

After transmission of data at block 808, process 800 may proceed to block 802 where the device performs another measurement. In some embodiments, the device may be configured to periodically perform the steps at blocks 802-808. For example, the device may perform the steps every hour, 12 hours, day, week, month, 6 months, year, or other suitable frequency. In some embodiments, the device may be configured to perform the steps at blocks 802-808 in response to a command. For example, the device may perform a measurement in response to a command transmitted from the computing device or other system external to the device.

Figure 9:
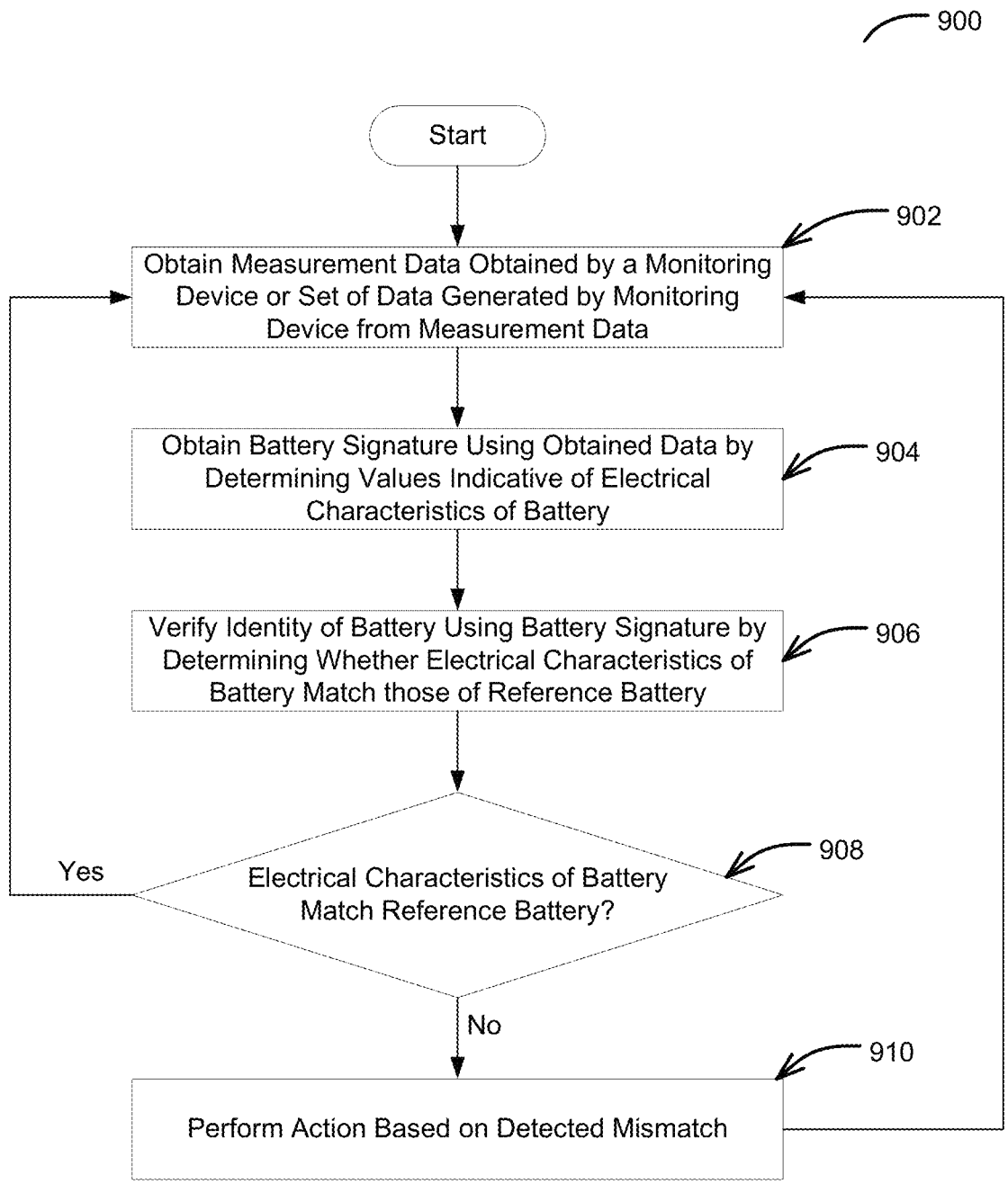
FIG. 9 illustrates a flowchart of an example process 900 of verifying an identity of a battery integrated with a monitoring device, according to some embodiments of the technology described herein.

FIG. 9 illustrates a flowchart of an example process 900 of verifying an identity of a battery integrated with a monitoring device, according to some embodiments of the technology described herein. In some embodiments, process 900 may be performed by computing device 206 described herein with reference to FIG. 2. In some embodiments, process 900 may be performed by battery verification system 208 described herein with reference to FIG. 2.

Process 900 begins at block 902, where the system performing process 900 obtains data obtained by a monitoring device. The data obtained by the monitoring device may be measurement data obtained by the monitoring device or a set of data generated by the monitoring device from measurement data. For example, the monitoring device may perform process 800 described herein with reference to FIG. 8 to obtain the measurement data or the set of data generated therefrom. The measurement data may include measurement of an electrical response of a battery integrated with the monitoring device to one or more electrical signals injected by the monitoring device. For example, the measurement data may include impedance measurements obtained from performance of an EIS measurement, or SOC measurements obtained from performance of an SOC measurement. In another example, the measurement data may include voltage measurements obtained while discharging or charging the battery.

In some embodiments, the system performing process 900 may be configured to obtain the data after performance of an authentication protocol verifying a unique identity of the monitoring device. For example, the authentication protocol may be performed as described herein with reference to block 804 of process 800, and/or as described herein with reference to FIG. 3A. The performance of the authentication protocol may verify a unique identity of the monitoring device to the system performing process 900. Thus, the system may trust that the data obtained by the monitoring device can be trusted (e.g., because the monitoring device belongs to an OEM).

Next, process 900 proceeds to block 904, where the system obtains a battery signature using the data obtained by the monitoring device. The battery signature may include values indicative of electrical characteristics of the battery. For example, the battery signature may include impedance measurements at various electrical signal frequencies included in the data. In another example, the battery signature may include SOC measurements of the battery. In some embodiments, the battery signature may include measurement values taken at different points in time. For example, the battery signature may include impedance measurements or SOC measurements obtained at different points in time. In some embodiments, the battery signature may be a blockchain storing measurement values obtained by the monitoring device (e.g., as described herein with reference to FIGS. 4A-4B).

In some embodiments, the data obtained by the monitoring device may include the battery signature. In some embodiments, the system may be configured to generate the battery signature. In some embodiments, the system may be configured to generate the battery signature from measurement data. In some embodiments, the system may be configured to generate the battery signature from the measurement data by appending the measurement data to a blockchain storing previously obtained measurement data. The updated blockchain may be the battery signature. In some embodiments, the system may be configured to generate the battery signature by using the measurement data as input to one or more functions to obtain output values of the battery signature. The battery signature may indicate electrical characteristics of the battery. For example, the battery signature may include impedance measurements of the battery for different electrical signal frequencies. In another example, the battery signature may include SOC values of the battery.

Figure 7:
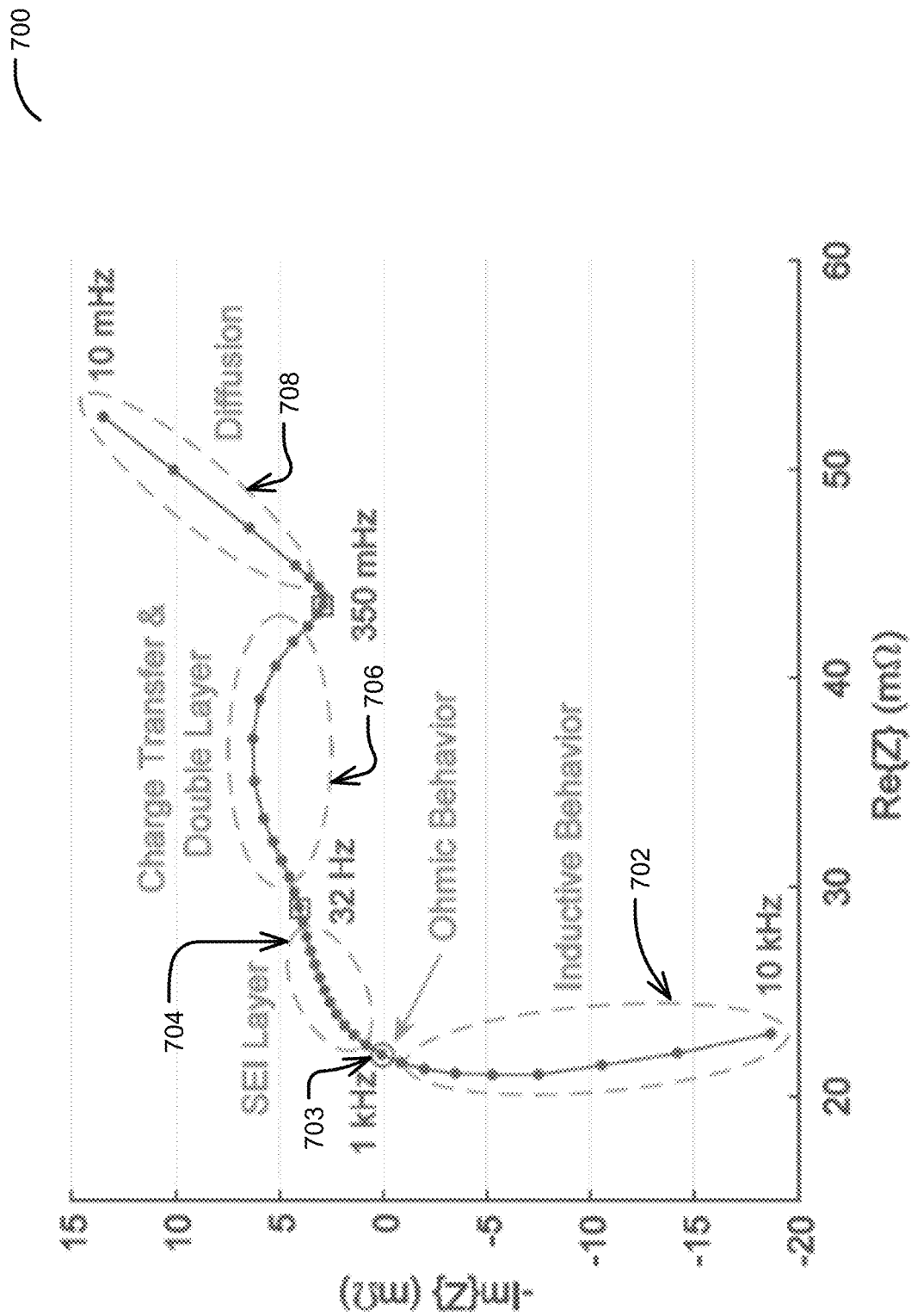
FIG. 7 illustrates an example of a battery signature 700, according to a non-limiting embodiment of the technology described herein.

FIG. 7 is an example plot 700 of a battery signature, according to some embodiments of the technology described herein. The plot 700 includes a plot of real and complex portions of an impedance measurement obtained from performing an EIS measurement on a battery. Each of the impedance measurements is associated with a respective frequency of an electrical signal injected into the battery. For example, plot 700 includes a first point for a 10 kHz signal, a second point for a 1 kHz signal, a third point for a 32 Hz signal, a fourth point for 350 mHz signal, and a fifth point for a 10 mHz signal. Different sets of impedance values are associated with different electrical characteristics of the battery. As shown in plot 700, the set 702 indicates inductive behavior of the battery, the point 703 indicates ohmic behavior of the battery, the set 704 indicates a state of the solid electrolyte interphase (SEI) layer, the set 706 indicates charge transfer and double layer, and the set 708 indicates diffusion in the battery. The values of the battery signature thus indicate electrical characteristics of the battery.

Next, process 900 proceeds to block 906, where the system verifies the identity of the battery using the battery signature. The system may be configured to verify the identity of the battery using the battery signature by verifying that the electrical characteristics of the battery match those of a reference battery. In some embodiments, the reference battery may be one that was originally integrated with the monitoring device. In some embodiments, the reference battery may be one approved by a manufacturer (e.g., for use in a particular product). In some embodiments, the reference battery may be a physical battery model. In some embodiments, the reference battery may be a model of a battery. For example, the model of the battery may include one or more parameters describing physical characteristics of the battery (e.g., impedance characteristics). In some embodiments, the system may be configured to verify the identity of the battery by comparing the battery signature to an expected battery signature. The expected battery signature may include values (e.g., impedance values) for a battery that the monitoring device is expected to be integrated with. For example, the expected battery signature may include values for a physical battery, or model of a battery that was integrated with the monitoring device during assembly.

Next, process 900 proceeds to block 908, where the system determines whether the electrical characteristics of the battery indicated by the battery signature match those of a reference battery. In some embodiments, the system may be configured to determine whether the electrical characteristics of the battery match those of the reference battery by determining a measure of difference between the battery signature and an expected battery signature. If the measure of difference exceeds a threshold, then the system may determine that the electrical characteristics of the battery do not match those of the reference battery. For example, the system may: (1) determine a measure of difference between impedance values of the battery signature and those of the expected battery signature; and (2) determine whether the difference exceeds a threshold difference (e.g., of 1 milliohm, 10 milliohms, 50 milliohms, 100 milliohms, or another suitable threshold difference). In another example, the measure of difference between values of the battery signature and those of the expected signature may be a Euclidean distance, variance of differences, mean difference, median difference, or other suitable measure of difference.

If at block 908 the system determines that the electrical characteristics of the battery do match those of the reference battery, then the system may verify that the battery integrated with the monitoring device is not a counterfeit battery and/or that the battery is not defective. Process 900 may then return to block 902 where the system obtains further data. If at block 908 the system determines that the electrical characteristics of the battery do not match those of the reference battery, then the system determines that the battery is a counterfeit and/or that the battery is defective. Process 900 may then proceed to block 910 where the system perform an action based on the detected mismatch. In some embodiments, the system may be configured to generate an alert informing of the detection. For example, the system may generate an alert in a user interface of a monitoring software application that indicates the detected counterfeit or defect. The system may be configured to indicate a corrective action to be taken based on the detection. For example, the system may indicate that the battery needs to be removed, replaced, or repaired.

Figure 10:
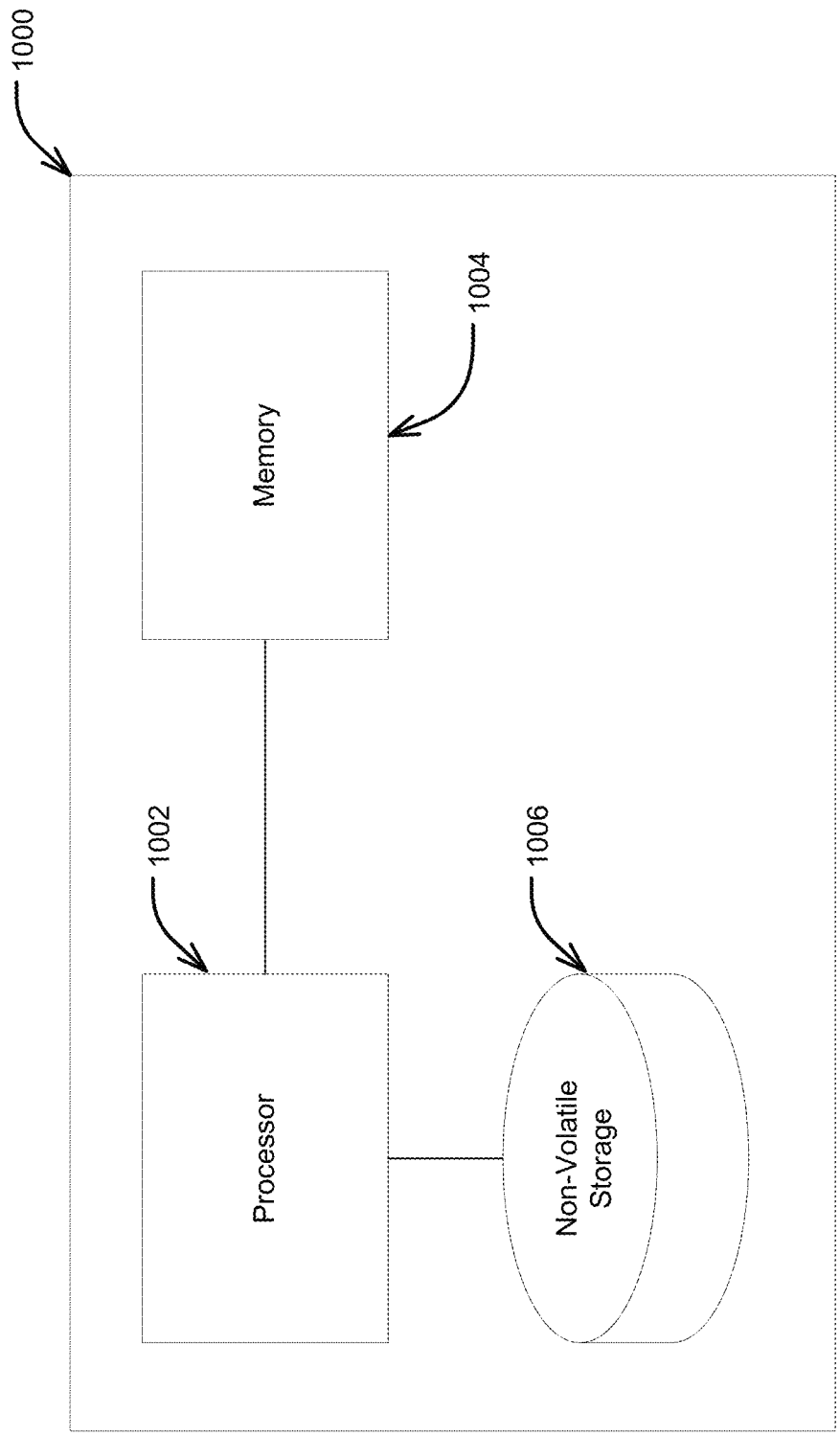
FIG. 10 illustrates a block diagram of an example computer system 1000 that may be used to implement embodiments of the technology described herein.

FIG. 10 illustrates a block diagram of an example computer system 1000 that may be used to implement embodiments of the technology described herein. The computing device 1000 may include one or more computer hardware processors 1002 and non-transitory computer-readable storage media (e.g., memory 1004 and one or more non-volatile storage devices 1006). The processor(s) 1002 may control writing data to and reading data from (1) the memory 1004; and (2) the non-volatile storage device(s) 1006. To perform any of the functionality described herein, the processor(s) 1002 may execute one or more processor-executable instructions stored in one or more non-transitory computer-readable storage media (e.g., the memory 1004), which may serve as non-transitory computer-readable storage media storing processor-executable instructions for execution by the processor(s) 1002.

The terms "program" or "software" are used herein in a generic sense to refer to any type of computer code or set of processor-executable instructions that can be employed to program a computer or other processor (physical or virtual) to implement various aspects of embodiments as discussed above. Additionally, according to one aspect, one or more computer programs that when executed perform methods of the disclosure provided herein need not reside on a single computer or processor, but may be distributed in a modular fashion among different computers or processors to implement various aspects of the disclosure provided herein.

Processor-executable instructions may be in many forms, such as program modules, executed by one or more computers or other devices. Generally, program modules include routines, programs, objects, components, data structures, etc. that perform tasks or implement abstract data types. Typically, the functionality of the program modules may be combined or distributed.

The invention claimed is:

1. A system for verifying an identity of a battery integrated with a monitoring device, the system comprising:
   a processor; and
   a non-transitory computer-readable storage medium storing instructions that, when executed by the processor, cause the processor to:
      after a first performance of an authentication protocol verifying a unique identity of the monitoring device, receive first data obtained by the monitoring device using a sensor of the monitoring device, wherein the first data comprises first measurement data obtained by the monitoring device or a first set of data generated from the first measurement data, wherein the first measurement data comprises a first measurement of an electrical response of the battery to a first one or more electrical signals injected by the monitoring device;
      obtain a first battery signature using the first data obtained by the monitoring device, wherein the first battery signature comprises a plurality of values indicative of electrical characteristics of the battery;
      verify the identity of the battery using the first battery signature at least in part by determining whether the electrical characteristics of the battery match those of a reference battery;
      after a second performance of the authentication protocol verifying the unique identity of the monitoring device, receive second data obtained by the monitoring device using the sensor, wherein the second data comprises second measurement data obtained by the monitoring device using the sensor or a second set of data generated from the second measurement data, wherein the second measurement data comprises a second measurement of an electrical response of the battery to a second one or more electrical signals injected by the monitoring device;
      obtain a second battery signature using the second data obtained by the monitoring device, wherein the second battery signature comprises a plurality of values indicative of the electrical characteristics of the battery; and
      verify the identity of the battery using the second battery signature at least in part by determining whether the electrical characteristics of the battery match those of the reference battery.

2. The system of claim 1, wherein the first battery signature is different from the second battery signature.

3. The system of claim 1, wherein verifying the identity of the battery using the first battery signature comprises comparing the plurality of values indicating electrical characteristics of the battery to an expected set of values.

4. The system of claim 3, wherein the expected set of values are determined according to an expected electrical response of the battery to the first one or more electrical signals.

5. The system of claim 1, wherein verifying the identity of the battery using the first battery signature comprises determining whether the battery is a counterfeit battery.

6. The system of claim 1, wherein verifying the battery using the first battery signature comprises determining whether the battery is defective.

7. The system of claim 1, wherein the first measurement data comprises measurement data obtained from performing electronic impedance spectroscopy (EIS) on the battery by the monitoring device.

8. The system of claim 1, wherein obtaining the first battery signature using the first data comprises generating the first battery signature using the first measurement data.

9. The system of claim 1, wherein the plurality of values are indicative of electrical characteristics of the battery at one or more frequencies, and/or at one or more temperatures.

10. A method for verifying an identity of a battery integrated with a monitoring device, the method comprising:
    using a processor to perform:
       after a first performance of an authentication protocol verifying a unique identity of the monitoring device, receiving first data obtained by the monitoring device using a sensor of the monitoring device, wherein the first data comprises first measurement data obtained by the monitoring device or a first set of data generated from the first measurement data, wherein the first measurement data comprises a first measurement of an electrical response of the battery to a first one or more electrical signals injected by the monitoring device;
       obtaining a first battery signature using the first data obtained by the monitoring device, wherein the first battery signature comprises a plurality of values indicative of electrical characteristics of the battery;
       verifying the identity of the battery using the first battery signature at least in part by determining whether the electrical characteristics of the battery match those of a reference battery;
       after a second performance of the authentication protocol verifying the unique identity of the monitoring device, receive second data obtained by the monitoring device using the sensor, wherein the second data comprises second measurement data obtained by the monitoring device using the sensor or a second set of data generated from the second measurement data, wherein the second measurement data comprises a second measurement of an electrical response of the battery to a second one or more electrical signals injected by the monitoring device;
       obtain a second battery signature using the second data obtained by the monitoring device, wherein the second battery signature comprises a plurality of values indicative of the electrical characteristics of the battery; and
       verify the identity of the battery using the second battery signature at least in part by determining whether the electrical characteristics of the battery match those of the reference battery.

11. The method of claim 10, wherein verifying the identity of the battery using the first battery signature comprises comparing the plurality of values indicating electrical characteristics of the battery to an expected set of values.

12. The method of claim 10, wherein the plurality of values indicate electrical characteristics of the battery at one or more frequencies, and/or one or more temperatures.

13. A device integrated with and configured to autonomously monitor a battery, the device comprising:
    a sensor;
    wireless communication circuitry;
    a processor; and
    a non-transitory computer-readable storage medium storing instructions that, when executed by the processor, cause the processor to:
       perform a first measurement on the battery using the sensor to obtain first measurement data at least in part by injecting a first one or more electrical signals into the battery and measuring an electrical response of the battery using the sensor, wherein the first measurement data indicates electrical characteristics of the battery integrated with the monitoring device;

perform, using the wireless communication circuitry, an authentication protocol with a computing device, separate from the device, wherein performance of the authentication protocol verifies a unique identity of the device to the computing device;

after performing the authentication protocol with the computing device, transmit, using the wireless communication circuitry, the first measurement data or a first set of data generated from the first measurement data to the computing device; and after transmitting the first measurement data or the first set of data generated from the first measurement data:

perform a second measurement on the battery using the sensor to obtain second measurement data at least in part by injecting a second one or more electrical signals into the battery and measuring an electrical response of the battery using the sensor, wherein the second measurement data indicates electrical characteristics of the battery integrated with the monitoring device;

perform, using the wireless communication circuitry, the authentication protocol with the computing device using the unique identity of the device; and after performing the authentication protocol with the computing device, transmitting, using the wireless communication circuitry, the second measurement data or a second set of data generated from the second measurement data to the computing device.

14. The device of claim 13, wherein the first set of data comprises a first battery signature.

15. The device of claim 13, wherein the first set of data comprises an encryption of the first measurement data.

16. The device of claim 13, wherein the instructions cause the processor to perform the first measurement when the battery is stored in a warehouse.

17. The device of claim 13, wherein performing the first measurement comprises performing an electronic impedance spectroscopy (EIS) measurement on the battery.

* * * * *